(12) United States Patent
Siebert et al.

(10) Patent No.: US 7,230,240 B2
(45) Date of Patent: Jun. 12, 2007

(54) ENHANCED SCANNING CONTROL OF CHARGED PARTICLE BEAM SYSTEMS

(75) Inventors: James Siebert, San Jose, CA (US); Lokesh Johri, San Jose, CA (US); Dennis McCarty, Fremont, CA (US); Simon Voong, San Francisco, CA (US); Madhumita Sengupta, Sunnyvale, CA (US); Hui Wang, Newark, CA (US)

(73) Assignee: Credence Systems Corporation, Milpitas, CA (US)

( * ) Notice: Subject to any disclaimer, the term of this patent is extended or adjusted under 35 U.S.C. 154(b) by 87 days.

(21) Appl. No.: 10/931,321

(22) Filed: Aug. 31, 2004

(65) Prior Publication Data

US 2006/0043312 A1    Mar. 2, 2006

(51) Int. Cl.
*H01J 37/147* (2006.01)
*H01J 37/256* (2006.01)

(52) U.S. Cl. .................. 250/306; 250/310; 250/398; 250/400

(58) Field of Classification Search ............ None
See application file for complete search history.

(56) References Cited

U.S. PATENT DOCUMENTS

| | | | | | |
|---|---|---|---|---|---|
| 4,698,509 | A | * | 10/1987 | Wells et al. | 250/492.2 |
| 5,825,670 | A | * | 10/1998 | Chernoff et al. | 702/85 |
| 2001/0002697 | A1 | * | 6/2001 | Hiroi et al. | 250/310 |
| 2002/0036761 | A1 | * | 3/2002 | Nakasugi | 355/53 |
| 2004/0158409 | A1 | * | 8/2004 | Teshima et al. | 702/22 |

OTHER PUBLICATIONS

Tsao, C.-C., et al., "Coaxial Ion-Photon System", article, Schlumberger Technologies and Orsay Physics, Elsevier Science Ltd., 6 pages (2001).
"IDS OptiFIB", brochure, Schlumberger Semiconductor Solutions, 4 pages (2002).
"FIB Focused Ion Beam—Applications, Specifications and Principle", Fraunhofer-Gesellschaft, http://www.iisb.fraunhofer.de/en/arb_geb/technology_an_fib.htm, 4 pages (2000).
Bunis, Carl B, et al., "The Utilization of Focused Ion Beam (FIB) and Field Emission Electron Microscopy (FE-SEM) in Failure Analysis and Process Characterization", M/A-COM Reliability Tech Brief, 5 pages (Jun. 23, 1999).

* cited by examiner

*Primary Examiner*—Nikita Wells
(74) *Attorney, Agent, or Firm*—Sughrue Mion, PLLC; Joseph Bach

(57) ABSTRACT

A charged particle beam system and scanning control method capable of imaging, and possibly editing, a device under test (DUT). The charged particle beam system contains a charged particle beam generation unit, such as a focused ion beam (FIB) column, which emits a charged particle beam onto the DUT. Also included is a scan controller arrangement implementing a finite state machine to control the application of the charged particle beam onto the DUT according to a plurality of scanning control parameters. The scanning control parameters may describe one or more scan regions that are rectangular in shape. Further, the parameters may describe one or more scan regions describing other shapes by way of a bit-map. Similarly, a method for controlling the scanning of a charged particle beam that involves obtaining a set of scanning control parameters, and then directing the charged particle beam as specified by the scanning control parameters by way of a finite state machine, is disclosed.

19 Claims, 12 Drawing Sheets

ENHANCED SCANNING CONTROL OF CHARGED PARTICLE BEAM SYSTEMS

FIELD OF THE INVENTION

The present invention relates generally to the field of charged particle beam systems, and more specifically to scanning control of charged particle beam systems.

BACKGROUND OF THE INVENTION

Focused ion beam, or "FIB," systems, represent a type of charged particle beam system that has become an important tool for integrated circuit (IC) manufacturers in bringing to the electronics marketplace highly reliable ICs that expand the bounds of capacity and performance.

To explain, a newly-designed custom IC typically is fabricated over a process of several weeks, involving preparation of silicon substrate wafers, generation of masks, doping of the silicon substrate, deposition of metal layers, and so on. Only after performing a long series of such steps is an actual IC produced for testing purposes.

Unfortunately, a new integrated circuit of any complexity rarely works as expected when first fabricated. Normally, some defects in the operation of the IC are discovered during testing. Also, some functions of the IC may operate properly under limited conditions, but fail when operated across a full range of temperature and voltage ranges in which the IC is expected to perform.

Once the IC has been tested, the designer may then make changes to the design, initiate the manufacture of a second prototype IC via the lengthy process described above, and then test the new IC once again. However, no guarantee exists that the design changes will correct the problems previously encountered, or that all of the problems in the previous version of the IC have been discovered.

To address these issues, IC manufacturers sometimes employ a FIB system to edit the prototype IC, thereby altering the connections between the transistors and other electronic structures embedded in the silicon layer of the device. By removing various sections of metal and other material to eliminate unwanted electrical connections, and by possibly adding metal segments to produce previously nonexistent circuit links, the design of the IC may be changed in a matter of a few hours or days instead of weeks, thereby greatly contracting the multiple-pass design-and-test cycle often employed to produce a defect-free IC.

Additionally, a FIB system is often used to generate an image of the integrated circuit. In conjunction with a CAD (Computer-Aided Design) layout of the various layers that make up the IC, a video image may be generated by the FIB system to aid in locating the specific areas of the IC that are to be edited. Use of such an image helps prevent editing mistakes which would normally render an IC useless.

With ICs generally becoming increasingly complex, and the number of transistors available within an IC continually growing, the use of a FIB system for imaging and editing an IC for altering the circuit design of the IC without engaging in multiple passes of the normal design-and-test cycle is well-known to improve overall time-to-market.

Generally speaking, FIB systems employ a high-powered, focused beam of metal ions, such as gallium, impinging the surface of an IC to provide the aforementioned imaging and editing capabilities. The width of the beam is typically on the order of a few nanometers so that extremely small features of the IC may be edited without unintended damage to the surrounding portions of the circuit. The beam is normally moved by electrostatic deflection of the beam by electronic control over the surface of the IC in a raster fashion. In other words, the beam is deflected across the surface in a series of closely-spaced horizontal parallel line segments, called "scan lines," which together typically cover a rectangular area of the IC, called a "scan frame" or "edit box." Along each scan line, the ion beam remains momentarily focused on each of a series of locations, called "pixels." Accordingly, the length of time the ion beam remains focused on a particular pixel, called the "pixel dwell time," determines the amount of etching or deposition that occurs on each impacted pixel of the DUT. The analog deflection of the beam, which ultimately determines the area to be scanned, the speed of the scan, the pixel dwell time, and so on, is typically controlled digitally by a microprocessor, microcontroller, digital signal processor (DSP), or similar software-driven algorithmic processor.

While the use of a microprocessor, DSP or similar device allows programmable, direct control of the focused ion beam in a FIB system, the potential speed and functionality of FIB system operation typically is restricted compared to a more hardware-intensive solution, thus possibly limiting the overall throughput and functional capability of the FIB system to edit an IC. For example, the pixel dwell time for current FIB systems typically is maintained constant throughout an entire scanning frame, and is normally determined by the size of the frame (or edit box) and the current of the ion beam. Modification of the pixel dwell time on a per-line or per-pixel basis, given typical dwell times on the order of 50–100 nsec, generally is not possible for even the fastest processors or DSPs, given the amount of overhead incurred in terms of the number of clock cycles required to execute each instruction of the software controlling the ion beam. In most FIB systems, limits on the number and length of the scan lines, the amount of pixel "overlap," and other scanning parameters are also prevalent.

Accordingly, a need exists in the art for an improved charged particle beam scanning control method and apparatus.

SUMMARY OF THE INVENTION

Generally, one embodiment of the present invention encompasses a charged particle beam system capable of imaging, and possibly editing, a device under test (DUT). The charged particle beam system contains a charged particle beam generation unit which emits a charged particle beam onto the DUT. One type of such a charged particle beam is a focused ion beam (FIB). Further, a scan controller arrangement implementing a finite state machine is employed to control scanning of the charged particle beam over the DUT according to a set of scanning control parameters. In one implementation, the scanning control parameters may describe one or more rectangular scan frames or regions, typically comprising multiple horizontal parallel scan lines, with each scan line composed of multiple pixels. In addition, the parameters may describe one or more "bit-mapped" scan frames or regions, whereby each pixel may be specified individually, thus allowing scanning of numerous shapes over the DUT.

Another embodiment of the present invention may be described as a method for controlling the scanning of a charged particle beam onto a DUT. First, a plurality of scanning control parameters is obtained. Then, a charged particle beam is directed onto each of a plurality of locations for a length of time as specified by the scanning control parameters by way of a finite state machine.

Generally, the use of a finite state machine implemented in a logic circuit, as opposed to a microprocessor or similar algorithmic device, to directly control the scanning of the charged particle beam allows faster, more accurate control of the charged particle beam when imaging or editing the device.

Additional embodiments and advantages of the present invention will occur to those skilled in the art upon reading the detailed description of the invention, presented below.

DETAILED DESCRIPTION OF THE INVENTION

1. System Description

Figure 1:
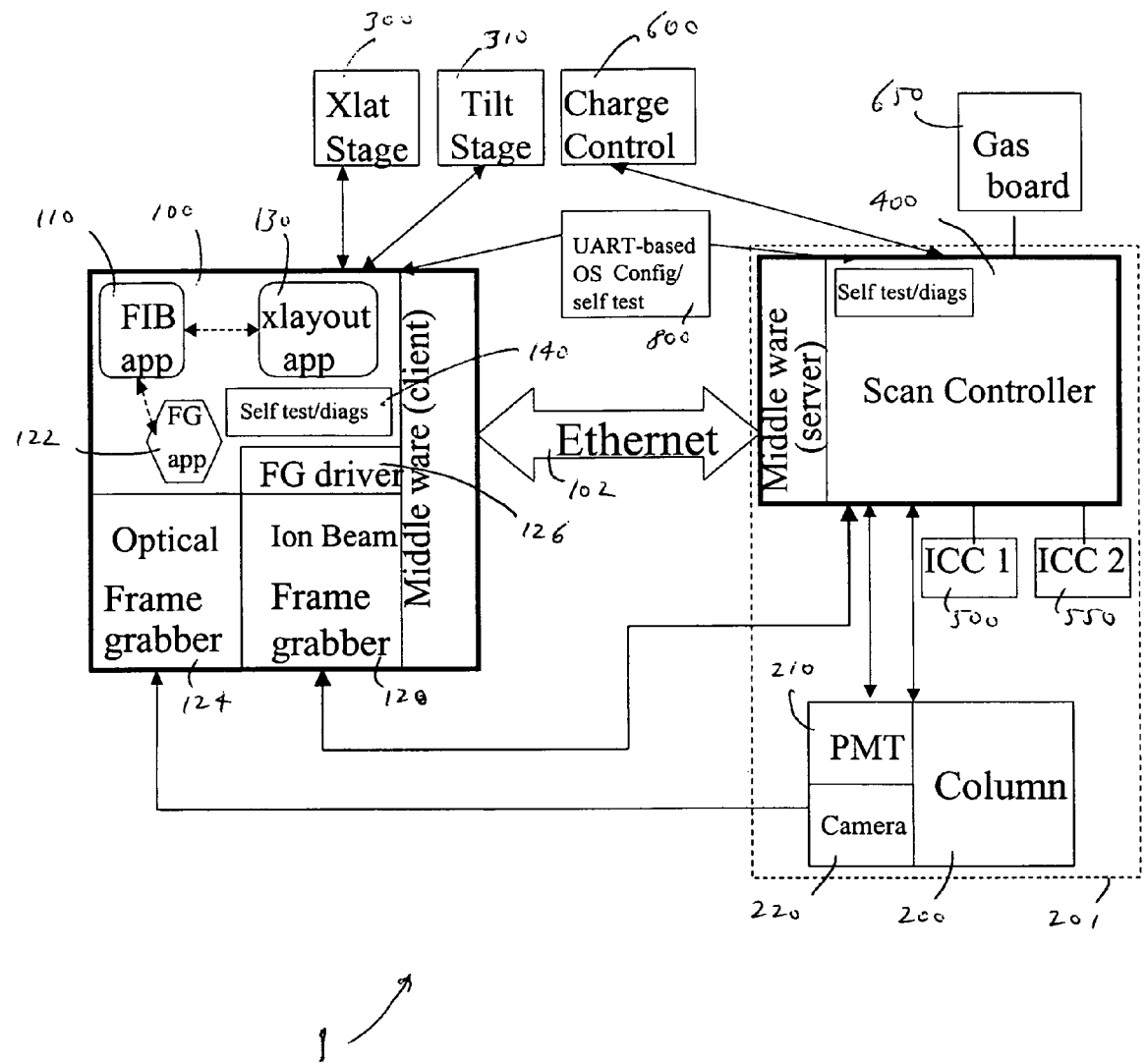
FIG. 1 is a block diagram of a charged particle beam system according to an embodiment of the invention.

One embodiment of the present invention generally takes the form of a FIB system 1 shown in FIG. 1. A user computer system 100, which, in this particular embodiment is a Sun Microsystems workstation running the Solaris operating system, runs software allowing a user high-level control of the scanning operation of a charged particle beam generation unit, such as a FIB column 200, housing the optics, electronics and related hardware that generate a focused ion beam impinging a device under test (DUT), such as an integrated circuit. The construction of various focused ion beam columns, such as that employed in the IDS OptiFIB™ system by Credence Systems Corporation, is well-known in the art. In addition to generating the FIB-based images mentioned above, some FIB systems, such as the IDS OptiFIB, also generate an optical image by way of a video camera in conjunction with an arrangement of optical components having a focal axis co-aligned with the focused ion beam. Some embodiments of the present invention are capable of utilizing the optical imaging capability of the IDS OptiFIB column in addition to the normal ion beam-based imaging functionality of most FIB columns.

The user computer system 100 includes a FIB application 110 that allows the user to program and control various aspects of the focused ion beam scanning process. For example, the FIB application 110 allows the user to specify various parameters of a FIB operation, such as a particular area of a DUT to be imaged, the specific structures of a DUT to be removed or added, and so forth, by way of a mouse, keyboard, or other means of input.

Preferably, the user computer system 100 also provides an ion beam frame grabber 120 that captures focused ion beam images generated by the FIB column 200, and an associated frame grabber application 122 that aids in displaying the captured frames on a monitor (not shown) of the computer system 100. Frame grabbers 120 ordinarily take the form of add-on circuit boards that may be installed into the motherboard of the user computer system 100. Additionally, an optical frame grabber 124 may be employed to capture optical images of the IC, such as those images generated by the video camera and related optical components of an IDS OptiFIB system. Frame grabbers 120, 124 often require a frame grabber driver 126 to allow the frame grabber application 122 to communicate with the frame grabbers 120, 124. Typically, the frame grabber driver 126 acts as a command translator, receiving access requests from the FIB application 110 by way of the operating system of the user computer system 100, and transforming those requests into access operations for the frame grabbers 120, 124.

A layout application 130 having access to CAD information describing the structure of the device under test may also be included in the user computer system 100 to allow the user to correlate the images presented by the frame grabber application 122 to the actual design of the DUT to more easily define the locations of the device to be edited, such as metal traces, transistors, or other circuit elements of the DUT. Typically, the layout application 130 facilitates this correlation by automatically superimposing the appropriate portion of the graphical CAD information atop the current FIB image of the DUT.

Other software possibly included in the user computer system 100 includes diagnostic routines 140 that verify the operational integrity of the computer system 100 and its various hardware and software components.

In addition to the FIB column 200, the user computer system 100 communicates with several other portions of the FIB system 1. For example, various serial ports, such as Universal Serial Bus (USB) ports, may be employed to control various aspects of the system, such as a translation stage 300 and a tilt stage 310 for the DUT. The translation stage 300 provides motorized translational movement of the DUT in all horizontal and vertical directions under the FIB column 200 to allow access to various portions of the DUT. The tilt stage 310 provides means whereby the DUT may be tilted in relation to the FIB column 200 to compensate for irregularities in the surface of the DUT or in the alignment of the translation stage 300 or the FIB column 200. Alternatively, other combinations of positioning stages allowing varying degrees of freedom of movement of the DUT in relation to the FIB column 200 may also be employed.

The user computer system 100 also communicates with a scan controller 400 (located in some embodiments within a housing 201 of the FIB column 200), which in turn controls the FIB column 200, a pair of ion column control (ICC) units (ICC1 500 and ICC2 550), a charge control unit 600, and a gas board 650, discussed below. In the embodiment of FIG. 1, the communication between the user computer system 100 and the scan controller 400 occurs over an Ethernet connection 102 in a client-server configuration; however, many other interfaces, such as Universal Serial Bus (USB), IEEE 1394, or a custom parallel or serial interface, may be employed in alternate embodiments. The scan controller 400 provides real-time control of these various units beyond that possible by way of direct control of the units by a microprocessor, microcontroller or DSP. The scan controller 400 is described in much greater detail below.

Figure 9:
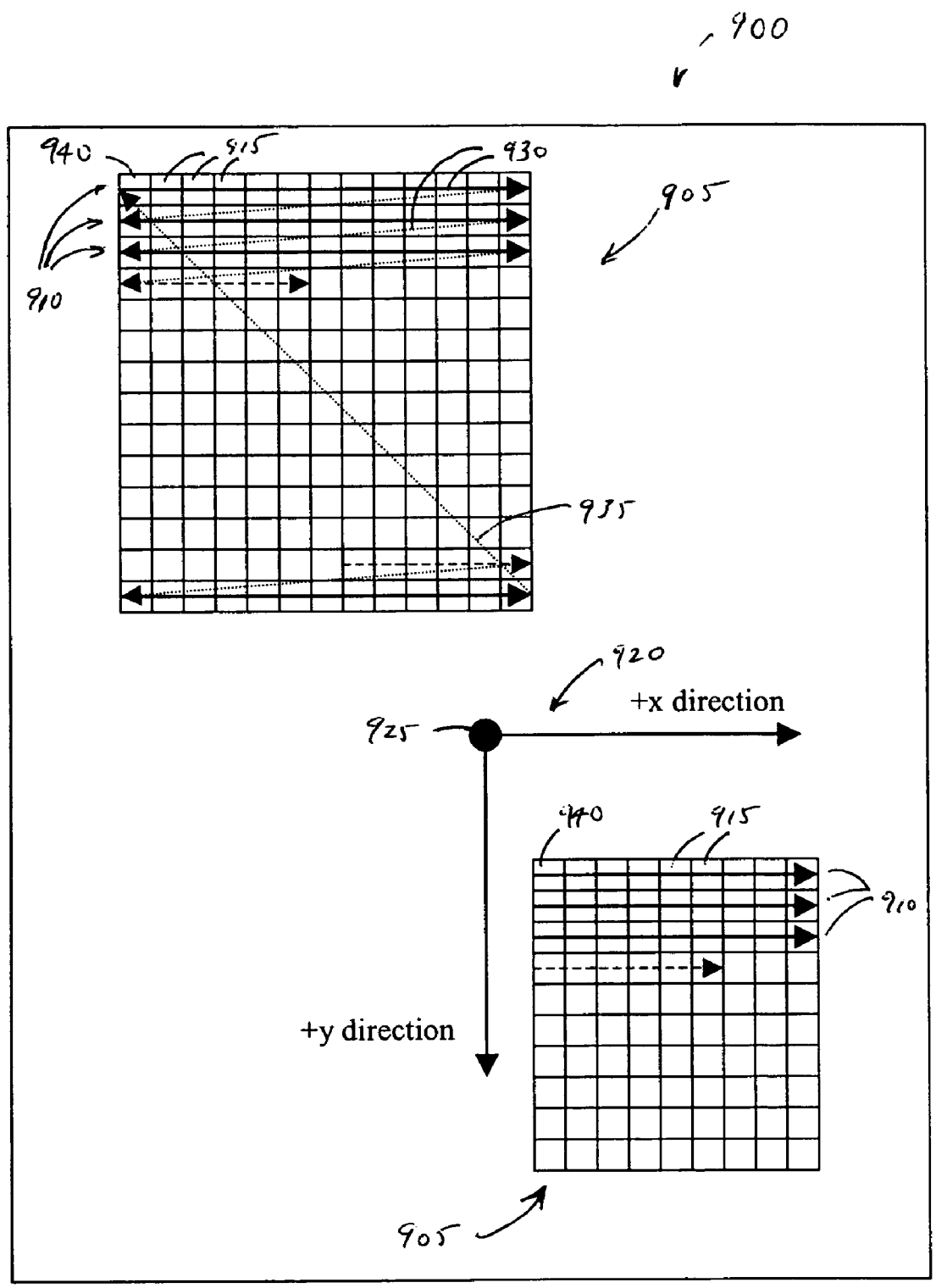
FIG. 9 depicts a field of view and enclosed scan frames of a device under test from the perspective of a charged particle beam system according to an embodiment of the invention.

The FIB column 200 takes as input from the scan controller 400 analog voltages which indicate the desired x-position and y-position of the focused ion beam within a particular "field of view." As shown in FIG. 9, a field of view 900 is typically an area of the DUT over which the focused ion beam may pass, pixel by pixel, for a given position of the FIB column 200 over the DUT and the particular programmed magnification and zoom offset provided by the ICC units 500, 550, described below. With the field of view 900, one or more areas of the DUT to be imaged or edited (called "scan frames," "scan regions" or "edit boxes" 905) may be defined, with each edit box 905 typically comprising one or more horizontal scan lines 910, which in turn consist of one or more pixels 915.

Further, the ion beam may be deflected with the field of view 900 by way of an x-y coordinate system 920 (depicted in FIG. 9), with an x-position denoting a horizontal location within the field of view 900, and a y-position denoting a vertical location within the field of view 900. The origin 925 within the field of view 900 (i.e., x-position=y-position=0) resides essentially at the center of the field of view 900, with increasing x-position values progressing to the right, and increasing y-position values progressing downward. In addition, each increase of one in the x-direction denotes one pixel, while an increase in one in the y-direction denotes one nominal scan line.

Depending on the width of the beam, which is also programmable by way of the ICC units 500, 550 (described below), and the step size of the scanning of the beam, each pixel along a scan line, or each scan line, may be separated from each other, aligned edge to edge (as shown in FIG. 9), or overlap by some percentage specifiable by the user by way of the user computer system 100.

The FIB column 200 also includes a photon multiplier tube (PMT) 210 that provides the ion beam imaging capability for the system 1. As the ion beam scans across the DUT, the device emits secondary electrons. Typically, the number of electrons emitted is determined by the specific material being impacted by the ion beam. The PMT 210 gathers the secondary electrons, from which it produces raw video image data which is passed to the ion beam frame grabber 120 of the user computer system 100 by way of the scan controller 400, for display on a monitor (not shown). As described more fully below, the scan controller 400 takes the raw video signal as input, applies a brightness control to it, generates video control signals for the raw video signal, and transfers the video and control signals to the user computer system 100. In addition, the scan controller 400 may also generate a digital version of the signal for use by the ion beam frame grabber 120.

In some embodiments, the FIB column 200 may also include an optical camera 220, such as that associated with the IDS OptiFIB system, mentioned above. The optical camera 220 produces a video signal for use by the frame grabber 124 of the user computer system 100. The optical camera 220 is useful in situations where the ion beam image generated by the PMT 210 does not provide sufficient contrast between the various physical structures of the DUT. Typically, this situation occurs when imaging and editing of an IC must occur through the substrate of the IC, as is normally the case with flip-chip ICs.

The ICC units 500, 550, using control signals received from the scan controller 400, supply the proper offset and magnification (or "zooming") to define the field of view (i.e., the area of the IC that may be imaged given the current location of the IC under the FIB column 200, as described above). The ICC units 500, 550 accomplish these offset and magnification functions by way of adjusting high voltage and offset amplifiers acting on the focused ion beam of the FIB column 200 to alter the deflection and aperture of the beam. In one embodiment of the invention, the width of the beam can adjusted by the ICC units 500, 550 to be as narrow as 20 nanometers (nm).

The charge control unit 600, otherwise known as a "flood control" unit, provides means for controlling the buildup of electric charge on the surface of the DUT. During normal operation of the FIB column 200 emanating a focused ion beam onto an IC, a positive charge typically accumulates on the surface of the IC impacted by the beam. In some cases, this positive charge may attain a level sufficient to damage or destroy the IC. To combat this problem, the charge control unit 600 can counterbalance this positive charge by periodically (e.g., once per scan frame) flooding the surface of the IC with electrons by way of an electron beam. In cases where flooding the IC once per scan frame is not often enough to limit the positive charge on the DUT to an acceptable level, activating the electron beam once per scan line may also be possible. The scan controller 400 provides the necessary control of the charge control unit 600 so that the electron beam is active while the focused ion beam is not active, such as during a horizontal retrace of the ion beam. Timing the electron beam in such a manner is important, as the editing and imaging of the DUT by the ion beam can be negatively affected if the electron beam is simultaneously active with the ion beam.

In one implementation of the invention, the charge control unit 600 also provides repel control functionality, whereby an electric field is applied near the end of the FIB column 200 nearest the DUT to prevent electrons of the electron flood operation of the charge control unit 600 from charging the glass surfaces of the optical elements of the FIB column 200. In one particular implementation, the electric field is applied before, and is released after, the electron flood operation to ensure the electrons of the flood operation do not charge the FIB column 200.

The gas board 650 causes the introduction of a small plume of gas from a gas supply into what is otherwise a vacuum environment to facilitate deposition of conductive and insulating material, as well as to assist in the etching process. Additionally, during deposition, gas in the immediate vicinity of the ion beam becomes depleted, requiring limited pixel dwell times and periodic replenishing of the gas environment by the gas board 650. For example, platinum and silicon dioxide in gaseous form may provide conductor and dielectric material, respectively, for use during material deposition. Further, although etching of the DUT may be performed with the focused ion beam alone, the etching process of both dielectric and metallic material can be accelerated using, for example, various forms of a halogen gas. In some embodiments, the scan controller 400 controls the operation of the gas board 650 by way of a serial communication link.

Additionally, the FIB system 1 of FIG. 1 provides a UART (Universal Asynchronous Receiver/Transmitter)-based remote tester 800 for the user computer system 100 and the scan controller 400 from which various system diagnostic and configuration functions may be initiated. Completion status of those tests may also be returned to the tester 800. Use of the tester 800, however, is not critical to the primary operations of the FIB system 1.

2. Description of the Scan Controller

Figure 2:
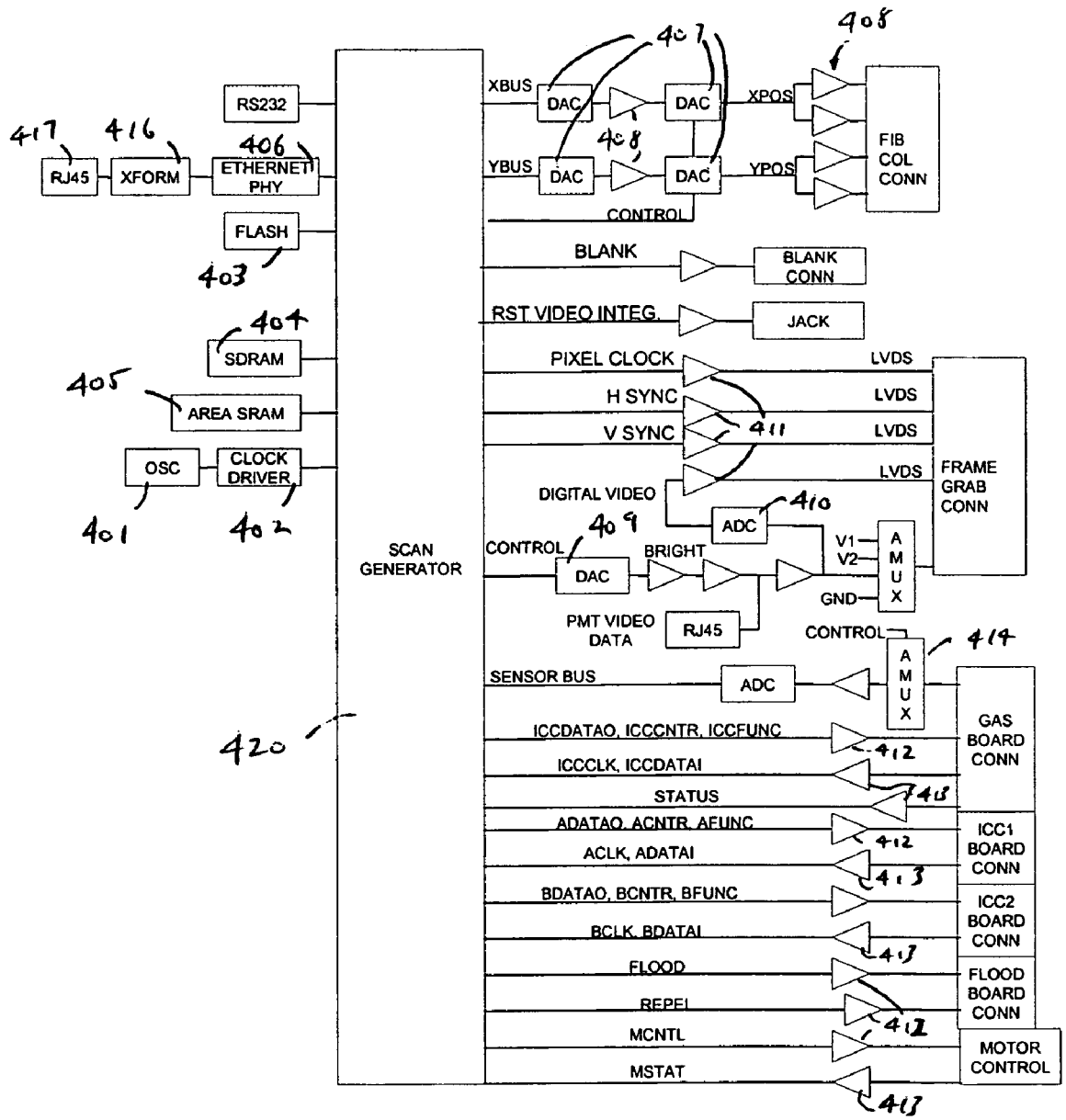
FIG. 2 is a block diagram of the scan controller of FIG. 1 according to an embodiment of the invention.

FIG. 2 is a block diagram further describing the scan controller 400 shown in FIG. 1. The scan controller 400 provides improved real-time control of the various units mentioned above involved in the imaging and editing of a DUT beyond that possible via direct control by a microprocessor, microcontroller, DSP, or similar software-driven algorithmic processing unit. Also, the video signals required by the ion beam frame grabber 120 of the user computer system 100 are similarly generated by the scan controller 400 to provide the user with an image of the area of the DUT being processed.

The scan controller 400 includes a scan generator 420, which provides processing power to control the FIB system 1 imaging and editing functions, as well as to provide the associated video control signals. In this particular embodiment, the scan generator 420 is packaged in a field programmable gate array (FPGA) which includes an Advanced RISC Machines (ARM) microprocessor 430 (shown in FIG. 3) and specialized digital hardware to control the scanning of the FIB column 200 and other functions. The particular FPGA employed in the embodiment described herein is an Altera Excalibur EPXA4, but many other FPGAs, as well as other programmable logic technologies, may be employed for the scan generator 420. Also, non-programmable logic devices, such as any of a variety of application-specific integrated circuits (ASICs) may be utilized as well. The contents and functionality of the FPGA are described in greater detail below.

Also contained in the scan controller 400 are an oscillator 401 and a clock driver 402 to clock the microprocessor 430 and other FPGA hardware. A FLASH memory 403, which is an electronically programmable, nonvolatile memory, is used primarily for storage of firmware that provides the program executed on the microprocessor 430. A synchronous dynamic random access memory (SDRAM) 404 is used for storing variable and stack data for the firmware running on the microprocessor 430. In addition, an area static random access memory (area SRAM) 405 holds scanning control parameters which describe various characteristics of a scan of a particular area of an IC. A detailed description of the use of the area SRAM 405 is provided below.

The scan controller 400 also provides the necessary interfacing hardware for communicating with the various processing units depicted in FIG. 1. For example, an Ethernet PHY (physical layer) circuit 406, an Ethernet signal transformer 416 and an Ethernet connector 417 provide the electrical signaling for the Ethernet connection 102 with the user computer system 100.

Also, a set of digital-to-analog converters 407 convert digital values produced by the scan generator 420 for the x-deflection and y-deflection of the focused ion beam to analog signals received by the FIB column 200 indicating the desired relative x-position and y-position of the beam. These signals are driven by buffers 408 prior to transmission from the scan controller 400 to the FIB column 200.

Further, the scan controller 400 provides a pixel clock, a horizontal sync signal, and a vertical sync signal to complement the ion beam analog video data (i.e. the image generated by the focused ion beam) generated by the PMT 210 of the FIB column 200. The pixel clock is a reference clock used by the ion beam frame grabber 120 to strobe or latch the video data within the ion beam frame grabber 120, while the horizontal and vertical sync signals indicate the end of each scan line and frame, respectively. In addition, a brightness control signal produced by the scan generator 420 is converted to analog form by a DAC 409 and then added to the PMT 210 analog video data to produce an analog video signal for the ion frame grabber 120 of the user computer system 100. Further, an analog-to-digital converter (ADC) 410 converts the analog video signal into a digital video signal which, along with the pixel clock, horizontal sync, and vertical sync signals generated by the scan generator 420, are transmitted to the ion frame grabber 120 by low-voltage differential signaling (LVDS) drivers 411, due to the high signaling speeds typically associated with digital video signals.

In generating the horizontal and vertical sync signals, the scan controller 400 employs a pixel delay, programmable by way of the user computer system 100, which compensates for inherent circuit delays in the imaging of the secondary electrons following the impingement of the ion beam on a particular pixel. Thus, the horizontal and vertical sync signals typically are delayed by a few pixel clocks so that these signals will align correctly with the video image data being transmitted to the ion beam frame grabber 120 of the user computer system 100.

Some frame grabbers 120 also require a series of "pseudo" pixel clocks prior to the beginning of the actual scan video data to prepare the frame grabber 120 in advance. To accommodate such hardware, the user computer system 100 may inform the scan controller 400 via the Ethernet connection 102 of the number of pseudo pixel clocks required, which may then be stored in an internal counter of the scan generator 420. This counter would then be checked by the scan generator 420 prior to the start of a scanning area, and the scan generator 420 would insert the number of pseudo clocks noted in the counter just prior to the start of the actual scan video data.

Various other signals driven and received by the scan generator 420 are conditioned by assorted signal buffers 412 and signal receivers 413. For example, an ion beam blanking signal and a reset video integrator signal are driven from the scan controller 420 by way of one of the signal buffers 412. The ion beam blanking signal informs the FIB column 200 to deactivate or deflect the ion beam so that it does not impinge the DUT. The reset video integrator signal resets an integrator circuit employed by the PMT 210 to reduce noise in the ion beam video image when low ion beam currents are used. Typically, the integrator is reset once per pixel. Also, one of various analog sensor signals from the gas board 650 are selected by way of an analog multiplexer (AMUX) 414, conditioned by a receiver 413, and then converted to digital form by an ADC 415 before being passed to the scan generator 420. Various other signals, including serial communication signals between the scan controller 400 and the gas board 650, ICC units 500, 550, and the control and status signals between the scan controller 400 and the charge control unit 600, use various signal drivers 412 and receivers 413 to similar end.

3. Description of the Scan Generator

Figure 3:
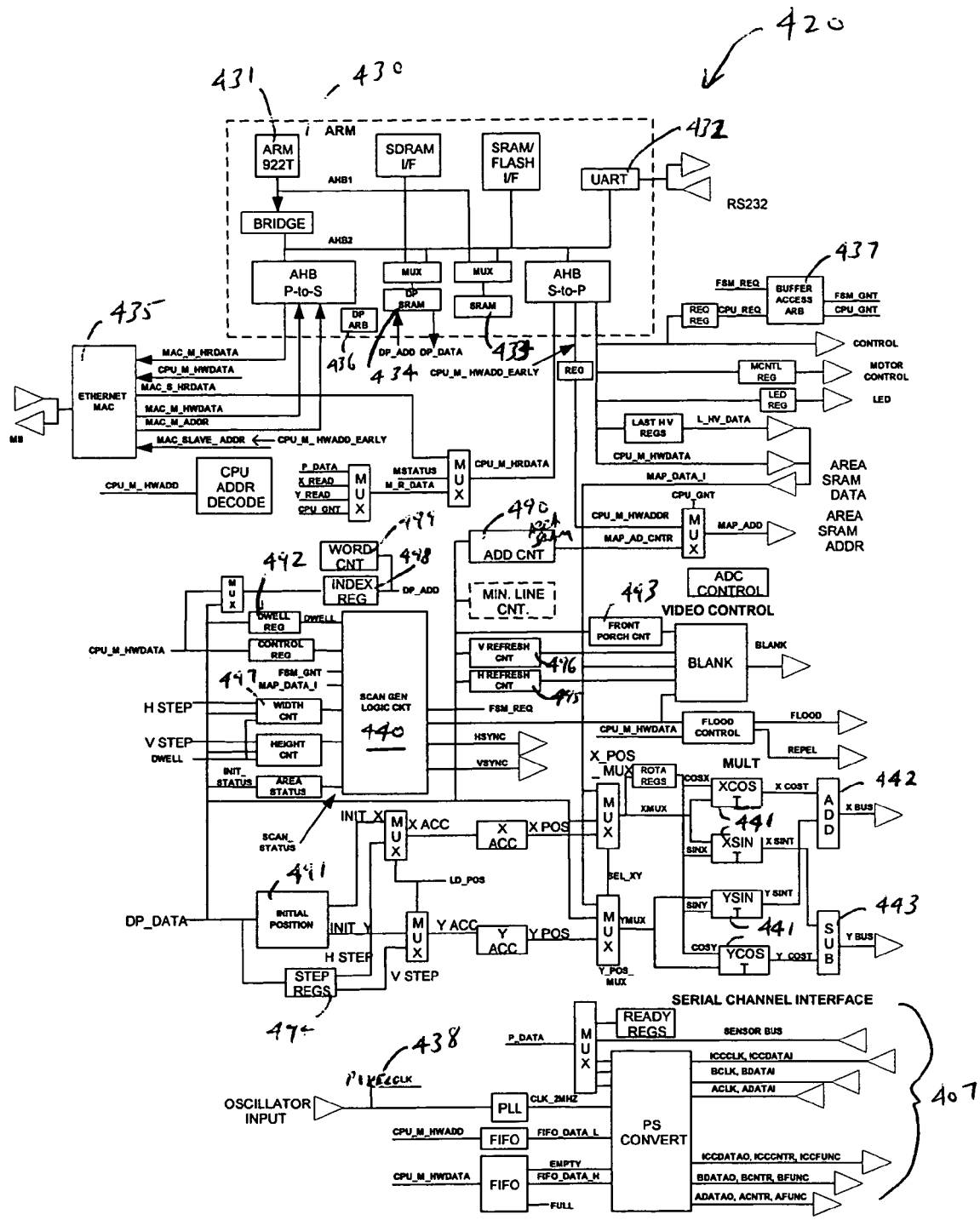
FIG. 3 is a block diagram of the scan generator of FIG. 2 within the scan controller of FIG. 1 according to an embodiment of the invention.

The increased speed and enhanced capability of charged particle beam scanning operations realized by embodiments of the present invention are provided to a great extent by the scan generator 420, a block diagram of which is presented in FIG. 3. As mentioned earlier, the scan generator 420 is implemented in a field-programmable gate array (FPGA) in one embodiment of the invention. The FPGA includes an Advanced RISC Machines (ARM) microprocessor 430 having a processor core 431, a UART 432 over which various system diagnostic and configuration functions may be initiated remotely, an internal SRAM 433 for data variable storage, an internal dual-port static RAM (DPSRAM) 434, and various interfaces to external components, such as the SDRAM 404 and FLASH memory 403 mentioned earlier. Any of a number of microprocessors, microcontrollers and the like may be employed in lieu of the ARM microprocessor 430 in a similar fashion.

Due to the real-time nature of the tasks controlled by the microprocessor 430, a real-time operating system (RTOS), such as VxWorks by Wind River Systems, Inc., is employed to allow the microprocessor 430 to control multiple tasks concurrently while responding to time-critical events quickly and efficiently. In alternative embodiments, any of a number of other RTOSes, whether commercially available or custom-designed, may be employed in the alternative.

The microprocessor 430 interfaces with several circuit blocks within the scan generator 420 to perform various tasks related to a FIB scan. For example, the microprocessor 430 communicates with an Ethernet media access control (MAC) circuit 435, which in turn communicates with the external Ethernet PHY circuit 406, mentioned earlier, so that the microprocessor 430 may communicate with the user computer system 100 via the Ethernet connection 102 (from FIG. 1). The user computer system 100 employs the Ethernet connection 102 to pass information to the microprocessor 430 regarding the scan to be performed by the scan controller 400 and, hence, the scan generator 420.

Also present within the scan generator 420 is a serial channel interface 407 which allows the microprocessor 430 to communicate with the ICC units 500, 550, and the gas board 650, described earlier, to direct the offset and magnification control of the ion beam and the application of gas for the etching and deposition of the DUT.

The scan generator 420 provides real-time generation of the scanning signals required by the FIB column 200, including the x-position and y-position signals for controlling the position of the ion beam, a blanking signal to deactivate or deflect the ion beam from the DUT, and electron flood and repel control signals.

Further, the scan generator 420 supplies the video control signals required for the ion beam frame grabber 120 of the user computer system 100 that provide a video representation of the area being scanned by the FIB column 200. These signals include horizontal and vertical sync signals, and a pixel clock, as described above. Also, additional signals may be supplied, depending on the nature of the frame grabber 120 employed.

The scan generator 420 produces both the scanning control and video control signals by way of a scan generation logic circuit 440 that implements a finite state machine (FSM). Generally, the microprocessor 430 provides initial information regarding the scan which it has received from the user via the FIB application 110 of the user computer system 100 over the Ethernet interface 102. The scan generation logic circuit 440 then accesses and processes the information to generate the scanning control and video signals in real time. By employing such a division of labor, the more time-critical tasks of generating the scanning control and video control signals described herein via the FSM with minimal real-time intervention by the microprocessor 430 allows greater speed and flexibility in the control of those signals, thus providing faster, more accurate imaging and editing of the DUT.

Communication between the microprocessor 430 and the scan generation logic circuit 440 is facilitated by two memory structures: the DPSRAM 434 located internal to the microprocessor 430, and the area SRAM 405 located external to the scan generator 420, but within the scan controller 400. A DPSRAM arbitration unit 436 integrated with the DPSRAM 434 facilitates cooperative access to the DPSRAM 434 by the microprocessor 430 and the scan generation logic circuit 440. Similarly, an area SRAM arbitration unit 437 embedded within the scan generator 420 provides the necessary arbitration logic to allow concurrent access of the area SRAM 405 by the microprocessor 430 and the scan generation logic circuit 440. In alternative embodiments, a single logic memory allowing communication between the microprocessor 430 and the scan generation logic circuit 440 may suffice.

Generally, the microprocessor 430 writes scanning control parameters regarding a scanning operation to the DPSRAM 434, and possibly the area SRAM 405, prior to the actual scanning operation. The scan generation logic circuit 440 then reads these parameters from the logic memories 405, 434 and applies the information to the FSM, which produces the high-frequency scanning and video control signals required.

More specifically, the microprocessor 430 writes to the DPSRAM 434 information defining the areas to be scanned by the ion beam of the FIB column 200, along with information imparting how the scan is to be executed. This information is derived from data transferred from the user computer system 100 which has been at least indirectly specified by the user by way of the FIB application 110.

In one embodiment of the invention, a user, by way of the FIB application 110 executed on the user computer system 100, may specify a scanning area and related information using two alternate methods. One method specifies a rectangular edit box or scan frame, typically by way of an initial x-position and y-position within the chosen edit box for the scan, and a scan width and scan height of the rectangular region. A second method specifies each individual pixel to be scanned during a scanning operation. The second method provides essentially unlimited ion beam scanning patterns or shapes, at the expense of more memory space. Thus, the first method provides a simple and efficient way to effect rectangular editing patterns on a DUT, while the second method allows more freedom in defining more "arbitrary" scanning patterns, such as circles or ovals, which may not be amenable to a typical rectangular scanning area co-aligned with the majority of the circuit elements of the DUT.

Figure 4:
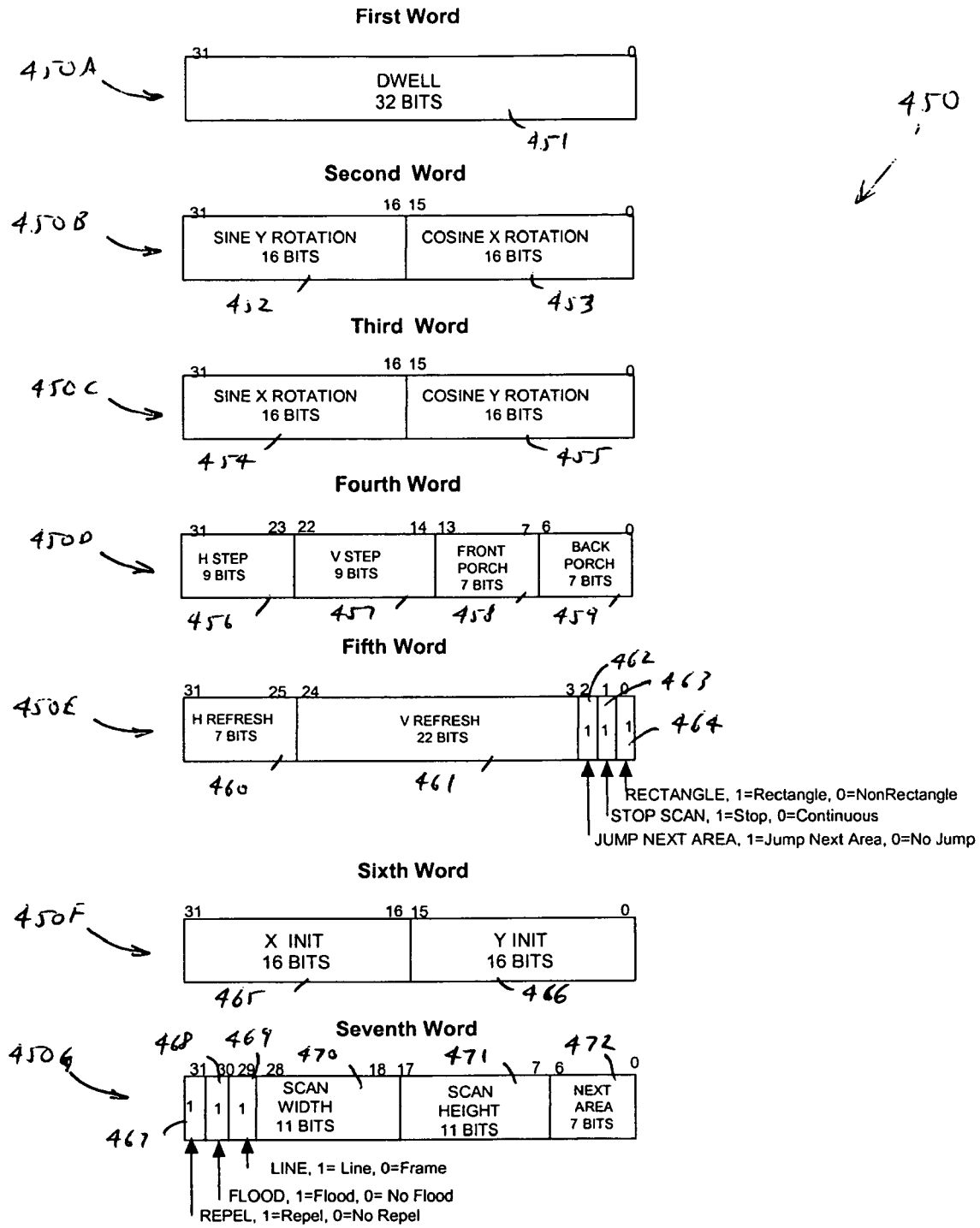
FIG. 4 depicts the field and flag definitions of a rectangular area definition data structure according to an embodiment of the invention.
Figure 10:
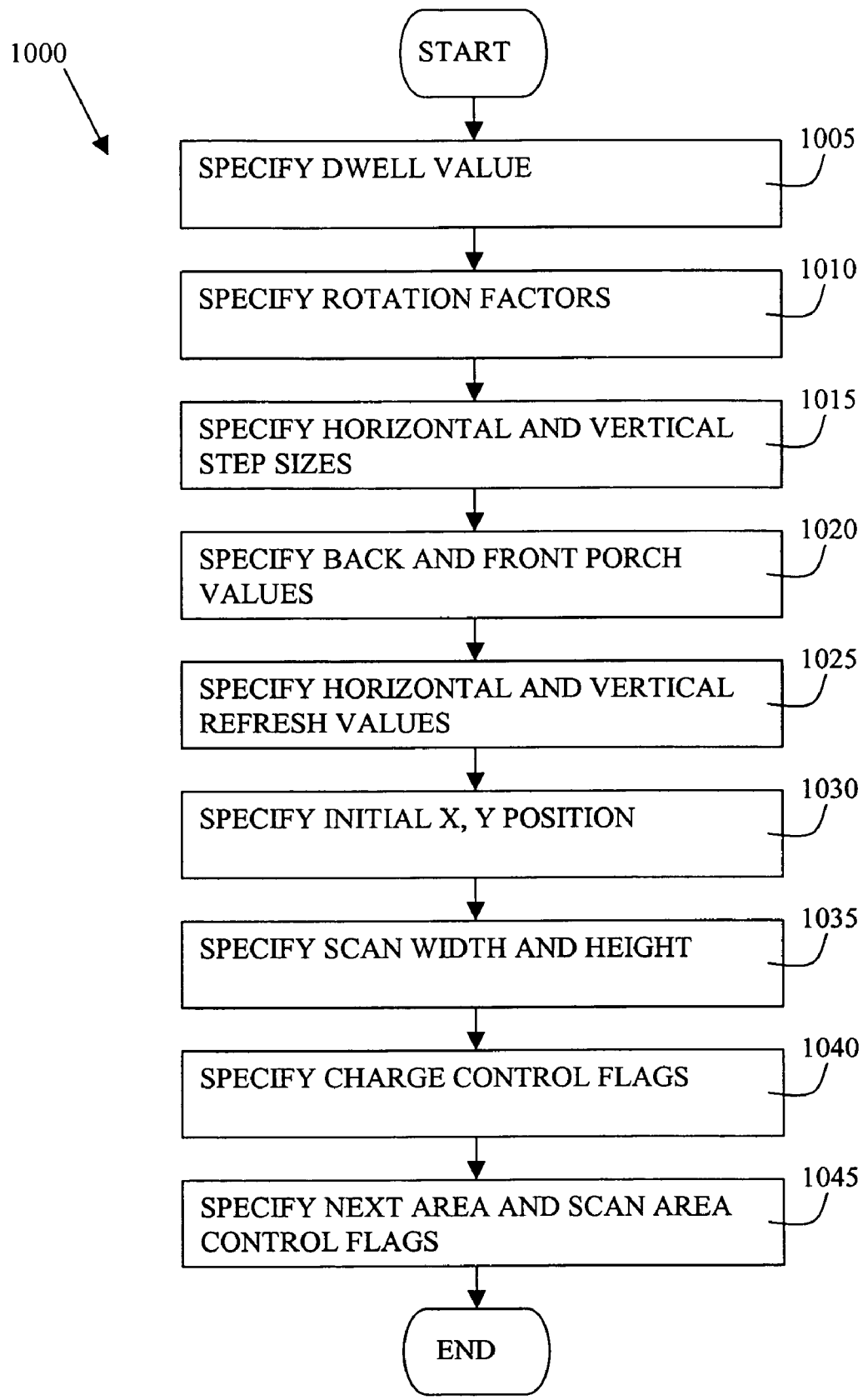
FIG. 10 is a flow chart of a method of defining a rectangular area scan according to an embodiment of the invention.

FIG. 4 illustrates a rectangular area definition data structure 450 denoting a rectangular scan, in accordance with a first method 1000 of defining a scanning area, displayed in FIG. 10. In one embodiment, the processor 430 writes the rectangular area definition data structure 450 in the DPSRAM 434 for subsequent access by the scan generation logic circuit 440. The data structure 450 comprises seven 32-bit-wide words 450A–450G. To facilitate the scanning and editing of multiple rectangular areas concurrently, multiple data structures 450 may be stored in the DPSRAM 434 for processing by the scan generation logic circuit 440.

Figure 11:
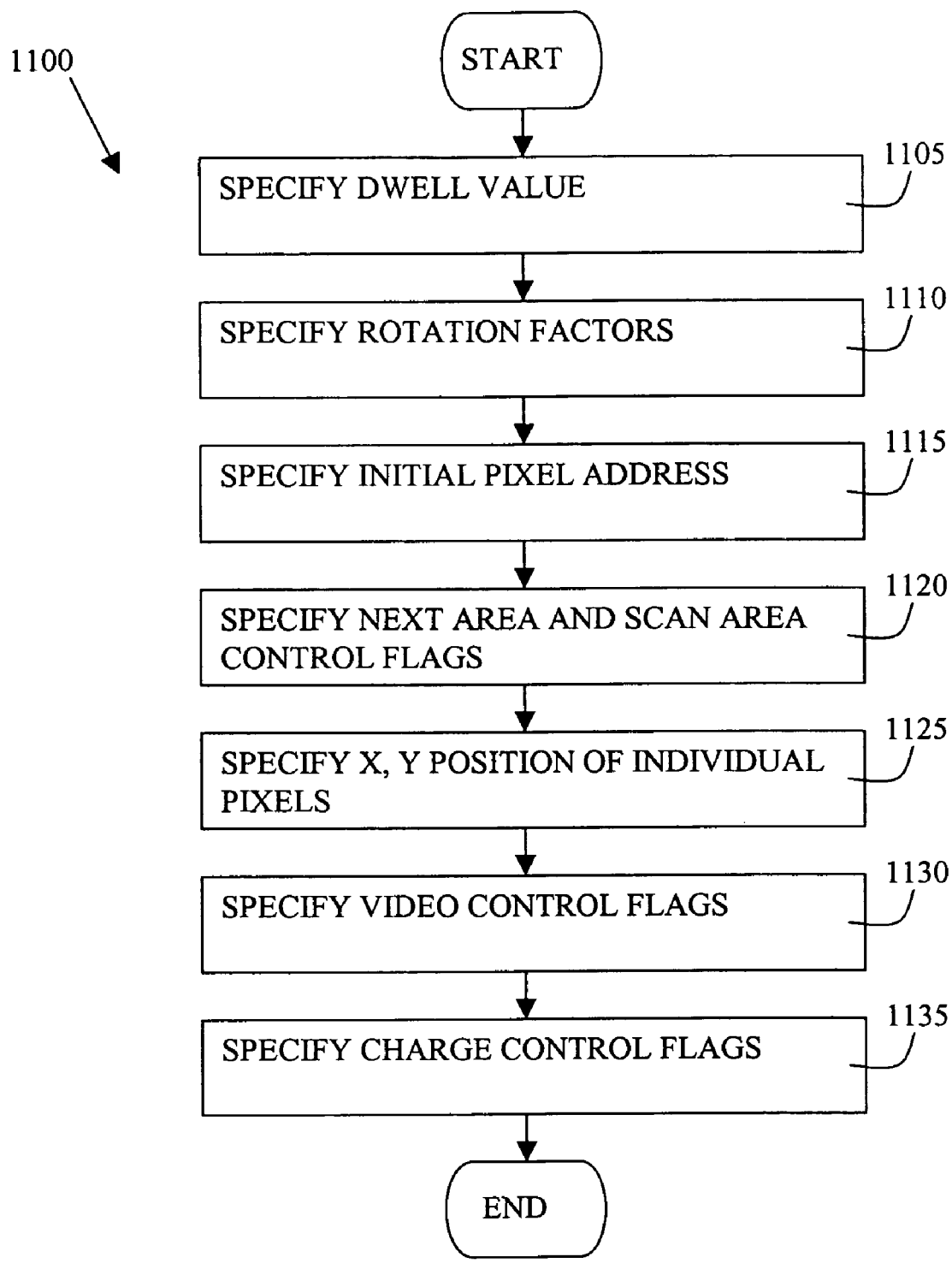
FIG. 11 is a flow chart of a method of defining an arbitrarily-shaped area scan according to an embodiment of the invention.

The particular order of defining steps of the first method 1000, related to defining a rectangular scan, and the steps of a second method 1100, associated with specifying a bit-mapped scan, as shown in FIGS. 10 and 11, is not critical; many other sequences of specifying the various parameters may also be employed.

The first word 450A of the rectangular area definition data structure 450 includes a dwell value 451 defining the length of time the ion beam resides on a single location (i.e., pixel) of the DUT (step 1005). In one embodiment, a scan pixel clock 438 (shown in FIG. 3) is nominally 30 megahertz (MHz), resulting in a nominal pixel dwell time of 1/(30 MHz), or approximately 33.3 nanoseconds (nsec). (In alternative embodiments, faster or slower scan pixel clocks may be utilized, depending on the speed and configuration of the circuitry contained in the scan generation logic circuit 440, and other factors.) A dwell value 451 of zero specifies the nominal pixel dwell time. For all other dwell values 451, the pixel scan clock 438 is divided by the stated dwell value 451, thus lengthening the resulting pixel dwell time by the corresponding amount. For example, a dwell value of 6 results in a pixel dwell time of six times the nominal dwell time, or 6×33.3 nsec=200 nsec. Accordingly, the maximum dwell time realizable with a 32-bit dwell value is 232 times 33.3 nsec, or about 143 seconds.

The second and third words 450B, 450C in the rectangular area definition data structure 450 define the rotation of the rectangular scan region (step 1010). As mentioned earlier, this rotation can be used to correct rotational mechanical misalignment between the FIB column 200 and the DUT. A misalignment of even a small fraction of a degree, which is possible with most mechanical fixtures employable to hold a DUT in a FIB system, requires some correction to align the ion beam deflection system of the FIB column 200 with the predominant layout of the various electronic elements of the DUT.

Alternately, a user may purposely rotate a rectangular scanning area in relation to the DUT by way of the FIB application 110 of the user computer system 100. Such an action may be taken, for example, to align the rectangular scanning area with a particular feature on the DUT, such as an angled metal trace, which is not aligned with the majority of the DUT circuit elements.

The second and third words 450B, 450C are divided into upper and lower 16-bit fields, with each field representing a sine rotation factor 452, 454 or a cosine rotation factor 453, 455 to be applied to each of the x-position and y-position values employed for the position of the ion beam within an edit box. In one embodiment of the invention, each rotation factor 452–455 ranges from a hexadecimal value of 0x7FFF (indicating a sine or cosine rotation factor of 1) to 0x0000 (indicating a sine or cosine rotation factor of 0) to 0x8000 (indicating a sine or cosine rotation factor of −1) in two's complement notation. These values are sine and cosine rotation factors for a pixel rotated about the origin of the field of view (described above) by the desired rotation angle. Using a normal x-y coordinate system with x and y axes of identically sized units, a rotation angle θ of a point $(x_1, y_1)$ would result in a new rotation-corrected point $(x_2, y_2)$ as follows by trigonometric identity:

$$x_2 = x_1 \cos θ - y_1 \sin θ$$

$$y_2 = x_1 \sin θ + y_1 \cos θ$$

However, in one implementation of the invention, raster scanning employs a y-axis that is reversed from a conventional x-y coordinate system (i.e., positive y values progress downward, as scanning progresses from left to right along the x-axis and top to bottom along the y-axis), and step sizes for the x and y axes may be different from each other, as well as change from scan to scan. As such, the sine and cosine values for the x-position and y-position must be scaled accordingly, resulting in separate sine and cosine rotation factors for the x and y directions (i.e., sine rotation factor x 454 and sine rotation factor y 452, cosine rotation factor x 453 and cosine rotation factor y 455). These factors are then used to mathematically manipulate in digital hardware (by way of four multipliers 441, an adder 442, and a subtractor 443) each pre-rotation x-position and y-position value produced by the scan generation control circuit 440 to generate rotation-corrected x-position and y-position values. The corrected values are ultimately transferred to the FIB column 200 to position the ion beam accordingly. The mathematical operation executed is as follows:

$$\text{Corrected } x\text{-pos} = (x^*(\cos \text{ rot factor } x)) + (y^*(\sin \text{ rot factor } y))$$

$$\text{Corrected } y\text{-pos} = (x^*(\sin \text{ rot factor } x)) - (y^*(\cos \text{ rot factor } y))$$

The fourth word 450D in the rectangular area definition data structure 450 contains four separate fields defining various aspects of the "scan" (i.e., the movement of the ion beam over the rectangular edit box). Two 9-bit fields define the horizontal step size ("H Step") 456 and vertical step size ("V Step") 457 of the scan (step 1015). The horizontal step size 456 indicates how many pixels the scan will advance with each step in the horizontal (x) direction, while the vertical step size 457 determines the number of nominal scan lines the beam will advance in the vertical (y) direction. With a 9-bit field value, a step size from 1 to $2^9$ (512) pixels or lines is possible. Ordinarily, the size of the ion beam being utilized during the scan influences the choice of the horizontal and vertical step sizes 456, 457. For example, the larger the beam, the larger the horizontal and vertical step sizes 456, 457 that may be employed while preventing gaps between the pixels and scan lines, if desired.

Figure 5:
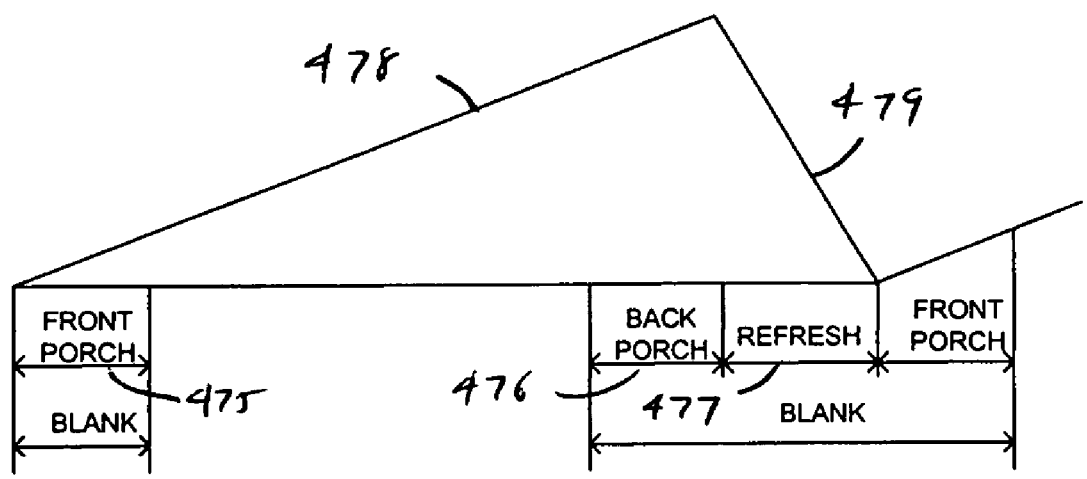
FIG. 5 depicts a front porch, back porch, and refresh periods of a horizontal scan line controlled by the scan generator of FIG. 3 according to an embodiment of the invention.

Also contained in the fourth word 450D are two 7-bit fields each defining a "front porch" value 458 and a "back porch" value 459, representing the length in pixels of the starting and ending areas of each scan line wherein the ion beam is not linear (e.g., around the time the beam has been moved between scan lines, when the beam is not progressing in a straight horizontal line) (step 1020). FIG. 5 shows a graphical representation of the horizontal progression of a horizontal scan line 478 as time proceeds from left to right. A front porch 475 and a back porch 476, as well as a horizontal "refresh" period 477 at the end of the scan line 478 during a repositioning 479 of the ion beam to the start of the next scan line, are illustrated. Thus, to effectively edit a particular scan line, the scan generation control circuit 440 blanks the ion beam at the beginning of each horizontal scan line during the front porch 475, and at the end of each scan line during the back porch 476 so that the ion beam impinges the actual area to be edited between the porches 475, 476 in straight horizontal lines. Thus, the use of the porches 475, 476 slightly reduces the left and right areas of the edit box that may actually be employed for editing. The size of the 7-bit front and back porch values 458, 459 allow the length of the porches to range from zero to $2^7$, or 128, pixels.

Referring again to FIG. 4, the fifth word 450E in the rectangular area definition data structure 450 allocates two fields for the abovementioned refresh period, further defining that time period as a 7-bit horizontal refresh period 460 and a 22-bit vertical refresh period 461 (step 1025). The horizontal refresh period 460 is, at a minimum, the time required to reposition the beam from the end of one horizontal scan line to the beginning of the succeeding scan line, as shown by the dotted arrows 930 in FIG. 9. Similarly, the vertical refresh period 461 is, at a minimum, the time required to reposition the beam from the end of the last scan line of a scanning frame to the beginning of the first scan line of the same or other scanning frame, depicted by the dotted arrow 935 in FIG. 9. In addition, the horizontal refresh period 460 and the vertical refresh period 461 may be increased to allow the gas board 650 to replenish the gas in the environment of the DUT that has been depleted as the result of depositing material onto, or etching material from, the DUT. The ion beam is blanked during both refresh periods 460, 461 to prevent extraneous imaging or editing during repositioning of the ion beam. The horizontal refresh period 460 may be $2^7$, or 128, clocks, while the vertical refresh period 461 may be $2^{22}$, or about 4.2 million, clocks, long, resulting in maximum periods of 4.27 μsec and 139.8 milliseconds (msec), respectively.

The fifth word 450E also allocates three flag bits: the Rectangle bit 464, the Stop Scan bit 463, and the Jump Next Area bit 462. The Rectangle bit 464, if set, indicates that the area to be scanned is rectangular, and thus the data structure definitions are as shown in FIG. 4 and the method of FIG. 10. Otherwise, the area to be scanned is not rectangular, and the bit-mapped area definition data structure 480 (shown in FIG. 6 according to the method of FIG. 11, and described in greater detail below) applies.

After the scan generation logic circuit 440 has caused the FIB column 200 to pass the ion beam along the last scan line of the scan frame (i.e., edit box), the Stop Scan bit 463 and the Jump Next Area bit 462 (step 1045) work in tandem to determine the next scanning action of the scan generator 420, as shown in Table 1 below:

TABLE 1

Stop Scan/Jump Next Area Bit Definitions

| Stop Scan | Jump Next Area | Scanning Action |
|---|---|---|
| 0 | 0 | Repeat the current frame |
| 0 | 1 | Scan frame denoted in the Next Area field |
| 1 | 0 | End scanning at end of the current frame |
| 1 | 1 | Scan frame denoted in the Next Area field |

The microprocessor 430 is interrupted at the end of each scanning region or frame so that the scan generation logic circuit 440 may be set up for another scan, if necessary, or stop. If scanning is to continue, either the current frame may be repeated immediately, or the scanning of another frame may be initiated. As a result, multiple frames may be scanned in sequence, possibly repeatedly. Repeating the scanning of a multiple set of edit boxes in series helps maintain processing throughput while allowing sufficient gas refreshing and charge control by limiting both the dwell time of each pixel and the frequency at which any particular pixel is edited. In one embodiment of the invention, if the scan is to end after the current scanning frame (Stop Scan bit=1, and Jump Next Area bit=0), the microprocessor 430 forces the finite state machine of the scan generation logic circuit 440 to an idle state. In other embodiments, the finite state machine may stop automatically in that particular case.

The operation of the finite state machine, as implemented in the scan generation logic circuit 440, including the FSM's use of the Stop Scan bit 463 and the Jump Next Area bit 462, are discussed in greater detail below.

The sixth word 450F in the rectangular area definition data structure 450 defines a 16-bit field each for an initial x-position 465 and an initial y-position 466 of the first pixel for the scanning region or frame within the field of view, which corresponds to the upper left-hand corner pixel 940 of the frame 905, shown in FIG. 9. Each of the fields defines the offset in two's complement notation. Hence, 0x7FFF indicates the maximum positive value, 0x8000 indicates the maximum negative value, and zero indicates a zero position. Thus, if the initial x-position 465 and the initial y-position 466 are both zero, the first pixel of the edit box resides within the center of the current field of view.

The seventh word 450G of the rectangular area definition data structure 450 provides three flag bits directing the control of the electron flood and repel control (described above) provided by the flood control unit 600 (step 1040). The flags (the Flood bit 468, the Repel bit 467, and the Line bit 469) indicate the flood and repel control actions to be taken by the scan generation logic circuit 440 as follows in Table 2 (where 'X' indicates a "don't care" value (i.e., either 0 or 1)):

TABLE 2

Flood/Repel/Line Bit Definitions

| Flood | Repel | Line | Action |
|---|---|---|---|
| 0 | X | X | No flood control |
| 1 | 0 | 0 | Assert flood control without repel after frame |
| 1 | 1 | 0 | Assert flood control with repel after frame |
| 1 | 0 | 1 | Assert flood control without repel between lines |
| 1 | 1 | 1 | Assert flood control with repel between lines |

As shown in Table 2, the scan generation logic circuit 440 may not implement an electron flood at all during the scanning area or frame, with or without repel only at the end of the frame, or with or without repel between each horizontal scan line. Typically, the user, via the user computer system 100, determines the proper use of flood control depending on the type of scan involved (etching versus deposition), the gas being utilized, the materials used to manufacture the device under test, and so on.

The seventh word 450G also provides two 11-bit scan width and scan height fields indicating a horizontal scan width 470 and a vertical scan height 471, respectively, of the rectangular scanning area in pixels and nominal scan lines, respectively (step 1035). As mentioned earlier with respect to the fourth word 450D of the data structure 450, each horizontal or vertical step may be composed of multiple pixels (horizontally) or scan lines (vertically). Thus, the 11-bit horizontal scan width 470 defines a range of 1 to $2^{11}$ (or 2048) horizontal pixels, and the 11-bit vertical scan height 471 defines a range of 1 to $2^{11}$ (or 2048) nominal scan lines.

Finally, the seventh word 450G allocates a 7-bit "next area" field 422 denoting the beginning memory address within the DPSRAM 434 of the rectangular area definition data structure 450 for the next scanning area to be processed (step 1045). Thus, this field, under the control of the Jump Next Area bit 462 (discussed earlier), acts as a kind of pointer to link one rectangular area definition data structure 450 to another to allow the scan generation logic circuit 440 to proceed from one rectangular scanning area to the next without direct intervention by the microprocessor 430. Alternatively, the next area field 472 may denote an index or offset of the start of the next area definition data structure from some base memory address within the DPSRAM 434.

A second "bit-mapped," or "arbitrary" area definition data structure 480 (shown in FIG. 6) that allows more variable or arbitrary scanning patterns, such as circular or radial scanning configurations, is provided in addition to the rectangular area definition data structure 450 discussed with respect to FIGS. 4 and 5. The rectangular area definition data structure 450 generally defines a scan frame or edit box in terms an initial starting pixel, a horizontal (pixel) step size, a vertical (scan line) step size, a scan width (in pixels), and a scan height (in scan lines), thus allowing the extent of the scan frame to be described with a few parameters. Alternately, the bit-mapped area definition data structure 280 allows the location (and possibly the dwell time) of each pixel to be specifically identified, thus allowing any arbitrary scanning pattern to be defined. The particular fields of the bit-mapped definition data structure 480 are specified according to the method 1100 defining a bit-mapped scan, as shown in FIG. 11.

Figure 6:
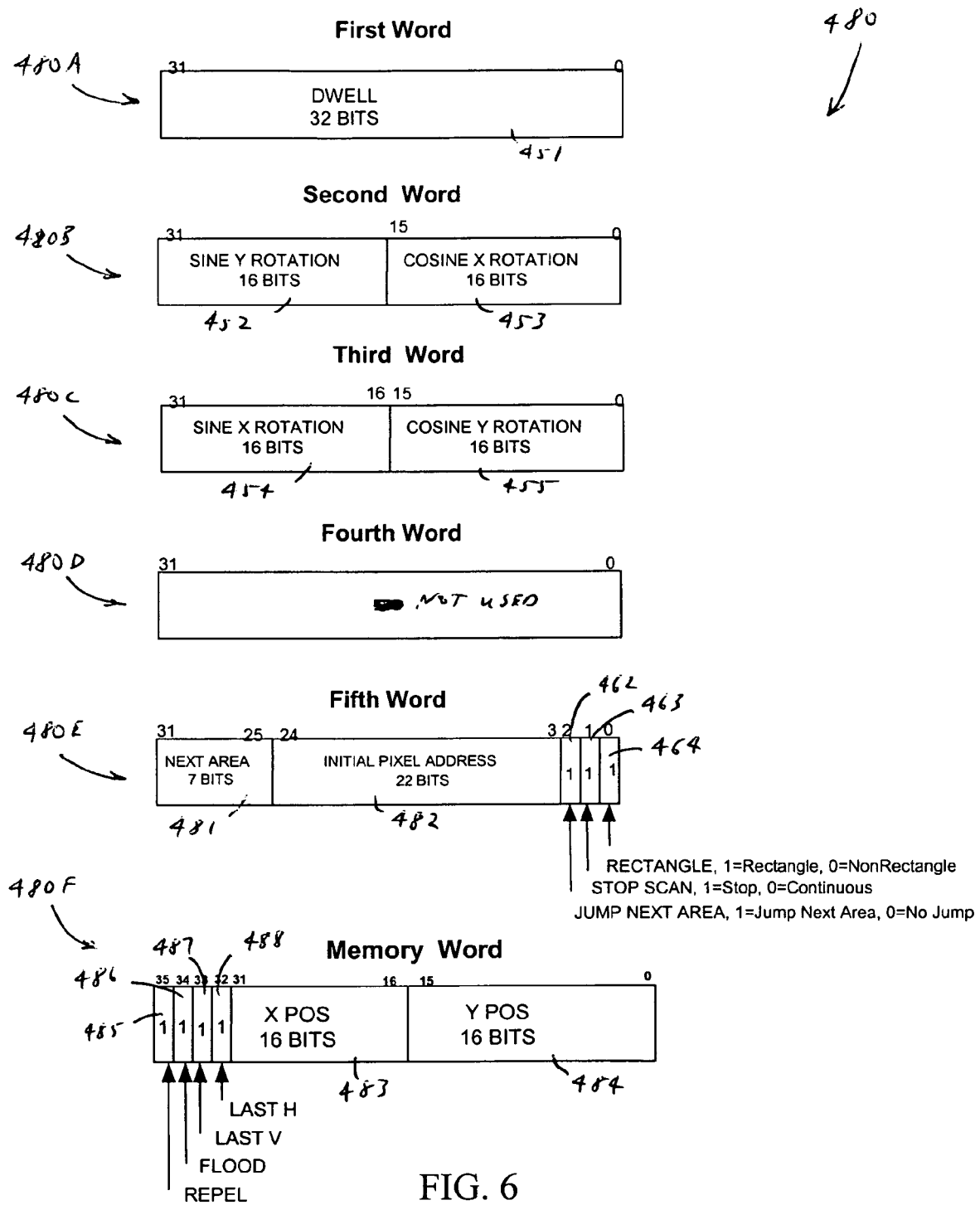
FIG. 6 depicts the field and flag definitions of a bit-mapped area definition data structure according to an embodiment of the invention.

As illustrated in FIG. 6, the bit-mapped area definition data structure 480 comprises five 32-bit words 480A–480E. As is the case with the rectangular area definition data structure 450, the bit-mapped area definition data structure 480 is placed within the DPSRAM 434 for retrieval by the scan generation logic circuit 440. In one embodiment of the invention, the first, second and third words 480A–480C of the arbitrary data structure 480 (indicating the pixel dwell value 451 and the rotation factors 452–455) are identical to those previously described for the rectangular area definition data structure 450 (steps 1105, 1110). The various fields of the fourth word 450D of the rectangular area definition data structure 450 are not utilized in the fourth word 480D of the bit-mapped area definition data structure 480, as any values specified for a horizontal step size, vertical step size, front porch, or back porch, as defined in the fourth word 450D of the rectangular area data structure 450, may have no meaning when a nonrectangular scanning pattern is generated.

The fifth word 480E of the bit-mapped area definition data structure 480 contains some data similar to that for the rectangular area definition data structure 450. For example, the Rectangle bit 464, the Stop Scan bit 463, and the Jump Next Area bit 462 are defined as described above with respect to the rectangular area definitions. In this case, the Rectangle bit 464 is set to zero, which causes the finite state machine of the scan generation logic circuit 440 to interpret the current data structure as a bit-mapped area (as opposed to a rectangular area) definition data structure 480, thus indicating use of the method 1100 for defining a bit-mapped scan. The Stop Scan bit 463 and the Jump Next Area bit 462 help define the next operation of the scan generation logic circuit 440 after the current bit-mapped scan has completed (step 1120).

Instead of defining horizontal and vertical refresh periods (see FIG. 4, fifth word), which are most useful for rectangular area scans that proceed in a rasterized fashion, the fifth word 480E of the bit-mapped area definition data structure 480 defines a 7-bit next area field 481 and a 22-bit initial pixel address field 482. The next area field 481 (specified in step 1120) performs the same function as the next area field 472 of the seventh word of the rectangular area definition data structure 450. The 22-bit initial pixel address field 482 (specified in step 1115) indicates the address within the area SRAM 405 holding the position of the first pixel of the bit-mapped area to be scanned.

Due to the arbitrary nature of the scanning area allowed by the bit-mapped area definition data structure 480, the position of each pixel to be scanned, along with other scanning control information, is defined in the area SRAM 405. In one particular implementation, consecutive scanning pixel locations are stored in consecutive memory locations within the area SRAM 405, beginning with the first pixel at the initial pixel address indicated in the fifth word 480E of the bit-mapped area definition data structure 480. Consecutive memory locations for each pixel are employed so that the scan generation logic circuit 440 need only increment the memory address by one for each pixel for efficient data extraction.

In one embodiment of the invention, the area SRAM 405 is organized in 36-bit words 480F. Two 16-bit fields in each word are allocated for the x-position 483 and y-position 484 of a pixel to be scanned, respectively (step 1125). The four remaining bits are flag bits defining various scanning and video control aspects of the scan. More specifically, a Last Horizontal flag 488 and a Last Vertical flag 487 are used to indicate when the finite state machine should generate a horizontal or vertical sync pulse for the video signal being transmitted to the ion beam frame grabber 120 of the user computer system 100 (specified in step 1130). In one particular implementation, the Last Horizontal flag 488 and the Last Vertical flag 487 may indicate that blanking signal should be active during that pixel. Also, a Flood flag 486 and a Repel flag 485 (specified in step 1135) indicate during which scan pixels the electron flood unit should be emitting electrons, and whether the repel control signal should be active during the electron flood, as depicted in Table 3:

TABLE 3

| Flood/Repel Bit Definitions | | |
| --- | --- | --- |
| Flood | Repel | Action |
| 0 | X | No flood control |
| 1 | 0 | Assert flood control without repel |
| 1 | 1 | Assert flood control with repel |

Figure 8:
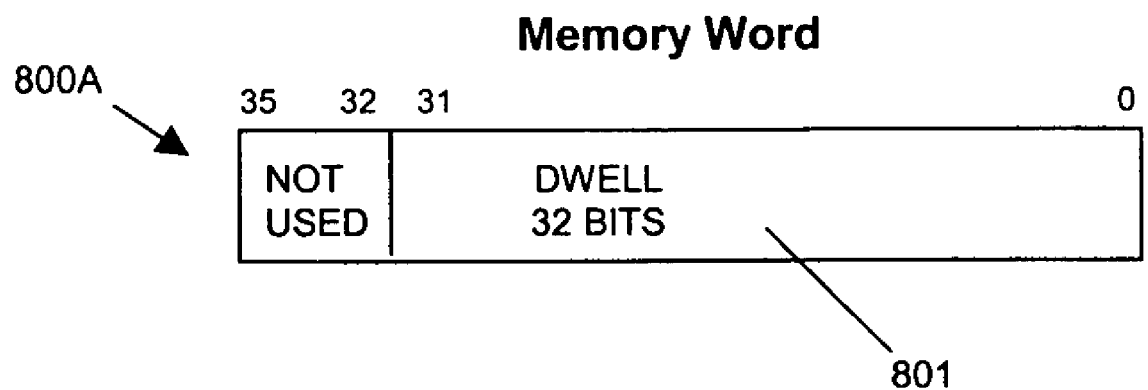
FIG. 8 depicts the field definitions for a memory word containing a dwell value for a pixel of a scan frame according to an embodiment of the invention.

In addition to the definition of the various pixel locations for a bit-mapped scanning operation, the area SRAM 405 may also hold a variable pixel dwell value 801 in a memory word 800A (shown in FIG. 8) for each pixel to be scanned, as opposed to the constant pixel dwell value 451 defined within the first word 450A, 480A of both the rectangular area definition data structure 450 and the bit-mapped area definition data structure 480. The variable pixel dwell value 801 may be used for either rectangular or bit-mapped scanning areas. If variable dwell times are employed with rectangular scanning areas, the variable dwell values 801 are preferably stored at consecutive memory locations within the area SRAM 405. However, if variable dwell values 801 are implemented in conjunction with a bit-mapped scanning area, the memory word 800A holding the dwell time for each pixel location preferably immediately precedes or follows the memory word 480F identifying the position of that pixel so that the scan generation logic circuit 440 may read through the area SRAM 405 sequentially during a particular scanning frame.

When variable dwell values are implemented, whether a rectangular or arbitrary scanning pattern is involved, the pixel dwell value 451 of the first word 450A, 480A of the rectangular area definition data structure 450 and the bit-mapped area definition data structure 480 is ignored. In alternative embodiments, one of the remaining unused bits in the memory work 800A may signify whether the signal is to be blanked for each particular pixel. In still another implementation, the memory word 800A may just indicate whether a pixel is to be blanked, with a constant dwell time being employed for each pixel by way of the pixel dwell value 451 from the first word 450A, 480A of the rectangular area definition data structure 450 and the bit-mapped area definition data structure 480.

Prior to initiating a scan operation, the microprocessor 430 sets other information required for a specific scan that is less time-critical in nature via the scan generator 420. Much of this information, such as motor control parameters and beam zoom and offset control values, is relayed to the various units of the FIB system 1, such as the translation stage 300, the tilt stage 310, and the ICC1 500 and ICC2 550 units, by way of the serial port circuitry 407 discussed above.

Figure 12:
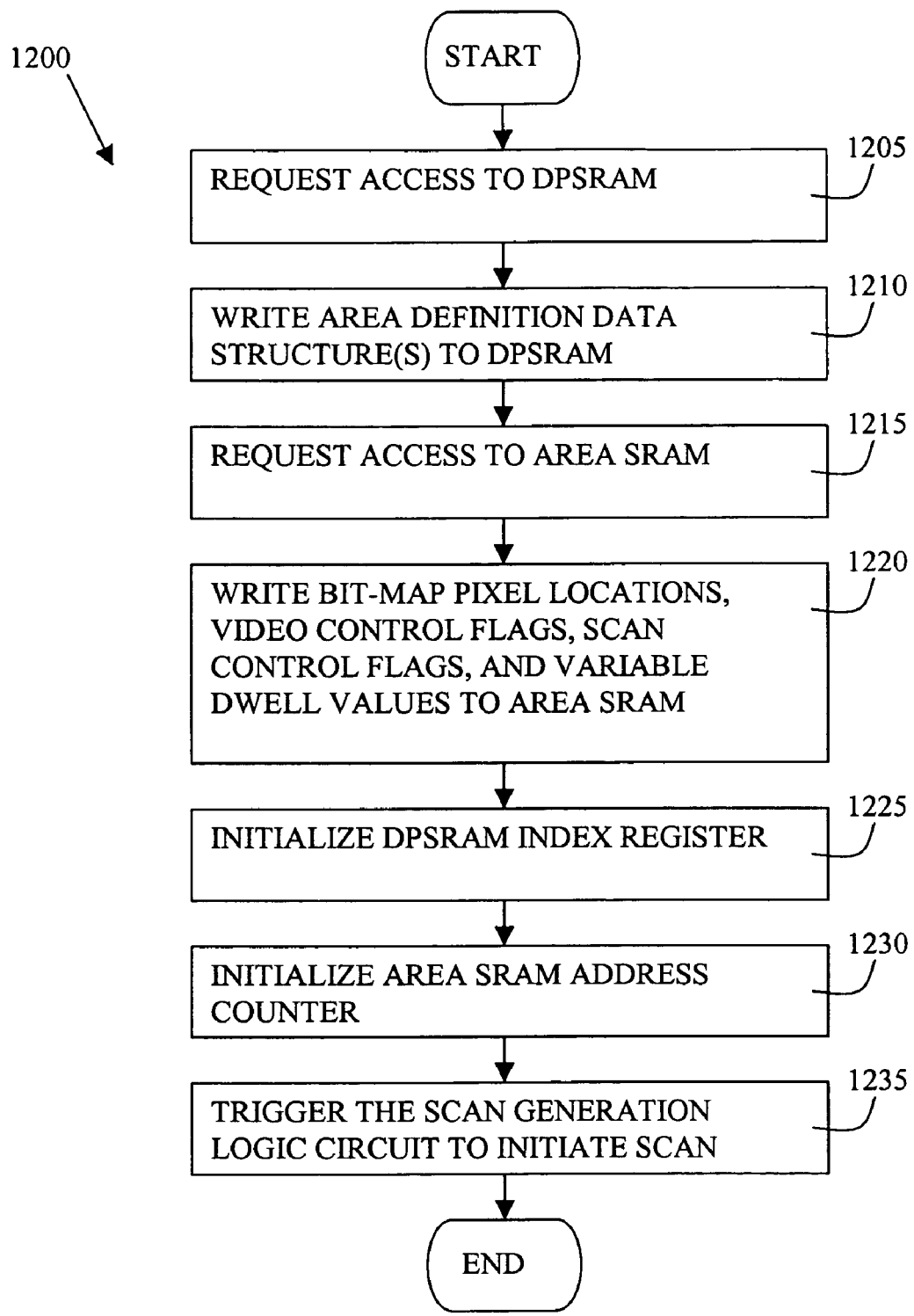
FIG. 12 is a flow chart of a method of preparing the scan generation logic circuit for a scanning operation according to an embodiment of the invention.

FIG. 12 is a flowchart illustrating a method to prepare the scan controller 400 for a scan, in accordance with one implementation of the present invention, as described below. This method allows the scan controller 400 to prepare the various area definition data structures 450, 480 prior to initiating the scan via the scan generation logic circuit 440.

To prepare for a scanning operation, the microprocessor 430 requests the DPSRAM arbitration unit 436 for access the DPSRAM 434 (step 1205), and then after access is granted, writes the DPSRAM 434 with one or more of the rectangular area 450 or bit-mapped area 480 definition data structures described above (step 1210). In one embodiment, both rectangular and bit-mapped structures 450, 480 may be processed sequentially by the finite state machine of the scan generation logic circuit 440, thus allowing flexibility in the geometries of the areas of the DUT to be scanned via a single initiation of a scanning operation. In addition, if at least one bit-mapped area definition data structure 480 has been written, the microprocessor 430 also requests the area SRAM arbitration unit 437 for access to the area SRAM 405 (step 1215), and then writes the area SRAM 405 with the bit-mapped data described above at the initial pixel address 482 defined in the fifth word 480E of the bit-mapped area definition data structure 480 (step 1220). In addition, whether rectangular or bit-mapped scanning areas are implemented, the area SRAM 405 may be written with variable pixel dwell values 801 within memory words 800A to allow different pixel dwell times for each pixel to be scanned (step 1220). After the various data structures 450, 480 are written, the microprocessor 430 then writes a DPSRAM index register 498 indicating the initial address of the first area definition data structure 450, 480 to be processed by the scan generation logic circuit 440 (step 1220). In addition, if variable dwell values 801 have been loaded into the area SRAM 405, the microprocessor 430 may also write an area SRAM address counter 490 within the scan generator 420 indicating the initial address of the first variable dwell value 801 in the area SRAM 405 (step 1225). The microprocessor 430 then triggers the scan generation logic circuit 440 to begin processing the scan (step 1230).

Figure 7:
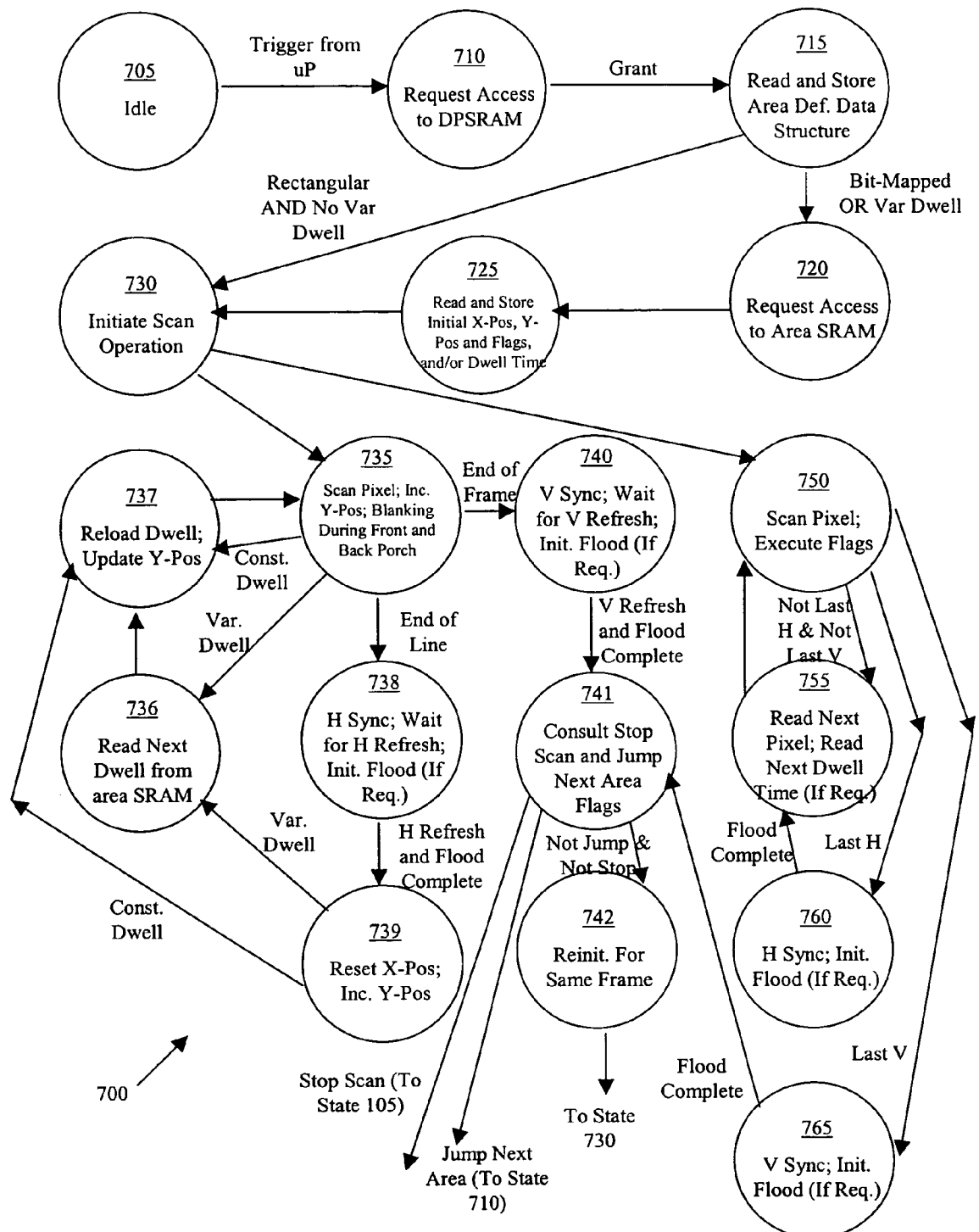
FIG. 7 is a state diagram for generating scanning and video control signals by way of a finite state machine implemented by the scan generator of FIG. 3 according to an embodiment of the invention.

The execution of the finite state machine by the scan generation logic circuit 440 is shown generally in the state diagram 700 of FIG. 7. Generally, the finite state machine allows the scan generation logic circuit 440 to control the position and blanking of the ion beam, the flood and repel functionality of the charge control unit 600, and the generation of the video pixel clock, horizontal sync, and vertical sync signals in real-time in digital hardware without assistance from the microprocessor 430, thus providing a fast, accurate control algorithm.

Initially, the scan generation logic circuit 440 remains in an idle state 705 awaiting a trigger signal from the microprocessor 430. The scan generation logic circuit normally enters this state upon a reset of the scan controller 400, or after the completion of a prior scan operation. In response to the trigger, the scan generation logic circuit 440 then begins processing the scan according to the finite state machine. First, the scan generation logic circuit 440 requests access to the DPSRAM arbitration unit 436 (state 710). Once that request is granted, the scan generation logic circuit 440 then reads the first data structure from the DPSRAM 434 indicated by the DPSRAM index register 498 in address order and loads each field of the structure into internal registers of the scan generation logic circuit 440 (state 715). Further, in one implementation, each succeeding address of the DPSRAM 434 accessed by the scan generation logic circuit 440 is addressed by incrementing a word count register 499 that is added to address held in the DPSRAM index register 498. Many of the parameters with the particular area definition data structure 450, 480 preferably are placed in countdown counters to cause various video or scan control signals to become active or inactive, as described in greater detail below.

Additionally, if the Rectangle bit 464 of the fifth word 450E, 480E of the current data structure is zero (indicating a bit-mapped scanning area), the scan generation logic circuit 440 also arbitrates for access to the area SRAM 405 via the area SRAM arbitration unit 437 (state 720), reads the first memory location specified by the bit-mapped area definition data structure 480 indicating the x-position 483 and y-position 485 of the first pixel, and loads those values into internal initial position registers 491 (state 725). If the Rectangle bit 464 is one, then the initial x-position field 465 and the initial y-position field 466 of the sixth word 450F of the rectangular area definition data structure 450 are loaded into the internal initial position registers 491 (state 715).

In addition, if the dwell times of each pixel are to be varied, the scan generation logic circuit 440 requests access to the area SRAM 405 (if it has not already done so), reads the first pixel dwell time from the appropriate memory location specified in the area SRAM address counter 490, and loads that value into an internal dwell register 492 (state 725). If, however, the pixel dwell values are constant, the pixel dwell value 451 from the data structure 450, 480 is loaded into the internal dwell register 492 (state 715).

At this point, the scan generation logic circuit 440 writes an internal register to commence the scan of the area (state 730). In alternative embodiments, scan initiation may occur by other electronic means, such as by way of activating a single signal or reading a particular memory-mapped location. The x-position and y-position values of the first pixel, having previously been loaded into the initial position registers 491, are rotation-corrected by the hardware arithmetic units 441, 442, 443 mentioned above, using the rotation correction factors 452–455 from the second and third words 450B, 450C, or 480B, 480C, and then are transferred to the FIB column 200. The pixel dwell value, having been loaded into the dwell register 492, determines how long the scan generation logic circuit 440 maintains the current x-position and y-position values at the FIB column 200 until they are changed. As mentioned above, the x-position and y-position values determine the amount and direction of deflection of the ion beam within the current field of view of the DUT.

How the scan progresses then depends on the type of area being scanned. For rectangular areas, the front porch value 458 of the fourth word 450D of the rectangular area definition data structure 450 previously read by the scan generation logic circuit 440 specifies the number of pixels at the beginning of a scan line during which the ion beam will be blanked, accomplished by way of a blanking signal provided as an input of the FIB column 200. This length of time preferably is measured by way of a countdown front porch counter 493 initialized to the specified front porch value 458. The counter 493 would then be decremented at each step by the horizontal step value 456, preferably stored in a step register 494, until it reached zero, at which point the ion beam would be unblanked. Further, an internal back porch counter (not shown in FIG. 3) may be loaded at the beginning of the scan line with the difference of the scan line length and the value in the back porch field 459 of the fourth word 450D of the rectangular area definition data structure 450, divided by the horizontal step size 456. The counter value would then be decremented for each step in the horizontal scan, and the blanking signal would be asserted when the counter reaches zero.

After the first scan line for a rectangular scan has been initiated, the first pixel x-position and y-position remain constant for the specified initial dwell value, which preferably is tracked by way of a down counter (not shown) within the scan generation logic circuit 440 that is loaded with the initial dwell value. After the counter has decremented to zero, the scan generator logic circuit 440 increases the x-position value by the amount specified in the horizontal step field 456 of the fourth word 450D of the rectangular area definition data structure 450 (state 737), thus altering the x-direction deflection of the ion beam accordingly via the FIB column 200. The counter containing the dwell time for the next pixel is refreshed in a manner dependent on whether a variable dwell time is specified. If the dwell time is constant, the same value specified in the rectangular area definition data structure 450 is reloaded into the dwell time counter (state 737). If a variable dwell time is employed, the scan generation logic circuit 440 reads the next value from the area SRAM 405 (state 736) and loads it into the dwell time counter (state 737). The control of the x-position and y-position for the ion beam continues in this fashion for the remainder of the current scan line.

Near the end of the scan line, as determined by the value of a width counter 497, initially set with the value of the scan width field 470 of the seventh word 450G of the rectangular area definition data structure 450, the scan generation logic circuit 440 blanks the ion beam when the internal back porch counter reaches zero, which indicates that the back porch portion of the scan line has begun. After the end of the current scan line has been reached, as evidenced by the value of the width counter 497 reaching zero, the scan generator logic circuit 440 continues to blank the ion beam for the number of pixel clocks signified by the horizontal refresh period field 460 of the fifth word 450E of the rectangular area definition data structure 450, stored in a horizontal refresh counter 495 (see FIG. 3). During the refresh period at the end of the scan line (state 738), the scan generator logic circuit 440 also consults the Flood 468 and Line 469 flags of the seventh word 450G of the rectangular area definition data structure 450 to determine whether an electron flood operation should be initiated at the end of the scan line. If an electron flood is enabled, the Repel flag 467 is also consulted to ascertain if the repel signal is also to become active at the end of the scan line. Also during the horizontal refresh period, the scan generation logic circuit 440 activates the video horizontal sync signal to indicate the end of the scan line within the video signal sent from the FIB column 200 to the ion beam frame grabber 120 of the user computer system 100 to ensure proper synchronization of the frame grabber 120 with the video signal.

After both the horizontal refresh period and the time necessary for the flood operation have elapsed, the scan generation logic circuit 440 resets the x-position value to its original value, and updates the y-position value by increasing it by the vertical step value 457 of the fourth word 450D from the rectangular area definition data structure 450, stored in the step registers 494 (state 739). Also, if a constant dwell time is implemented, the internal counter for the pixel dwell time is reinitialized to the pixel dwell value 451 indicated in the first word 450A in the rectangular area definition data structure 450 (state 737). Alternately, if the dwell time is to be altered for each position of the ion beam, the scan generation logic circuit 440 reads the next dwell value from the area SRAM 405 and loads it into the dwell counter (states 736, 737). A scan of the next line is then initiated (state 735).

Each horizontal scan line then progresses in a similar fashion. At the end of the last line of the current frame or rectangular area after the back porch period has elapsed, the scan generation logic circuit 440 blanks the ion beam for a vertical refresh period 461, stored in a vertical refresh counter 496, and activates the video vertical sync signal (state 740). Also, the scan generation logic circuit 440 consults the Flood 468 and Line 469 flags originally residing in the seventh word 450G of the rectangular area definition data structure 450 to determine whether an electron flood should be initiated at the end of the scan frame. If so, the Repel flag 467 is also consulted to ascertain if the repel signal is also to become active at the end of the last scan line.

Once both the flood operation (if initiated) has ended and the vertical refresh period has elapsed, the scan generation logic circuit 440 employs the Stop Scan 463 and Jump Next Area 462 flags of the fifth word 450E of the rectangular area definition data structure 450 to determine if another scan is to commence (state 741). More specifically, if the Stop Scan 463 and the Jump Next Area 462 flags are both zero, scanning of the current frame is to be repeated using the same definition data structure currently in use (state 742). If Stop Scan 463 is one and Jump Next Area 462 is zero, the scanning process halts at the end of the current frame, and the scan generation logic circuit 440 blanks the ion beam indefinitely (idle state 705).

Finally, if Jump Next Area 462 is one, scanning proceeds at the start of the frame indicated in the next area field 472 of the seventh word 450G of the rectangular area definition data structure 450. In response, the scan generation logic circuit 440 requests access to the DPSRAM 434 (state 710), and once that request is granted, reads the area definition data structure (state 715), whether rectangular 450 or bit-mapped 480, along with possibly some values from the area SRAM (states 720, 725), and begins the process of scanning the associated area of the DUT (state 730), as described above.

In one particular embodiment, the Jump Next Area 462 and Stop Scan 463 flags are defined such that the Jump Next Area flag 462 takes precedence over the Stop Scan flag 463. In other embodiments, the reverse may be true.

In the case the current area being processed by the scan generation logic circuit 440 is bit-mapped rather than rectangular, a slightly different process is followed. Once the bit-mapped area definition data structure 480 is read from the DPSRAM 434 (state 715), the scan generation logic circuit 440 arbitrates for access to the area SRAM 405 (state 720), and then uses the initial pixel address field of the fifth word 480E to read the initial x-position 483, y-position 484 and associated flags 485–488 from the area SRAM 405 at that address (state 725). In addition, if the pixel dwell time is variable from location to location on the DUT, the scan generation logic circuit 440 reads the dwell 801 from the area SRAM 405 (state 725). In one implemenation, the variable dwell value 801 is held in the memory location 800A immediately after the location holding the initial x-position and y-position of the associated pixel.

The scan generation logic circuit 440 then sets the x-position and y-position of the ion beam, corrected by the rotation factors 452–455 provided by the second and third words 480B, 480C in the bit-mapped area definition data structure 480, and unblanks the beam while initiating the scan (states 730, 750). The scan generation logic circuit 440 then allows the ion beam to dwell on that location for the stated dwell time, and then moves the beam to the next position on the DUT described by the next memory location in the area SRAM 405, and setting the dwell time to either a constant value specified in the first word 480A of the bit-mapped area definition data structure 480, or a value specific to that location as specified in the area SRAM 405 (state 755).

Each bit-mapped location on the DUT specified in the area SRAM 405 is transferred in a rotation-corrected form for use by the FIB column 200. As mentioned above, each memory location also indicates by way of the Last Horizontal 488 and Last Vertical 487 flags of the memory word 480F whether the video horizontal sync signal (state 760) or the vertical sync signal (state 765) is to become active during that beam position on the DUT. In some embodiments, the Last Vertical flag 487 may indicate the end of the bit-mapped scanning area, in which case the Stop Scan 463 and Jump Next Area 462 flags of the fifth word 480E of the bit-mapped area definition data structure 480 would be employed (state 741) to determine if scanning should cease, if the current frame scan should be repeated, or if another scanning frame should be processed. In alternate embodiments, a separate flag within the bit-mapped area definition data structure 480 or the area SRAM 405 may be employed to the same effect.

In addition, the Flood 486 and Repel 485 flags of the memory word 480F associated with each bit-mapped position in the area SRAM 405 inform the scan generation logic circuit 440 when the flood control signals should become active, according to the related discussion presented above.

Given the non-rasterized nature of a bit-mapped scan, use of a front porch period, back porch period, horizontal refresh period, or vertical refresh period is not contemplated in conjunction with a bit-mapped scan of some embodiments. However, many of the same physical phenomena these variables were designed to address, such as the need to periodically refresh the gaseous environment during a scan, the blanking of the non-linear regions of the ion beam at the start and end of a scan, and so on, are preferably addressed within the actual design of the bit-mapped scanning process, as defined by the data in the various locations in the area SRAM 405. Closely controlling the length of each continuous series of locations to be scanned, the amount of dwell time and blanking involved, and so forth, promote that effort. Alternately, other embodiments of the invention may employ values such as the front and back porches and horizontal and vertical refresh periods associated with rectangular scan areas for use with bit-mapped scanning areas.

4. Conclusion

While embodiments of the present invention have been presented within the environment of a FIB system, other charged particle beam systems may benefit from the use of the disclosed embodiments. For example, a scanning electron microscope (SEM), which typically employs a beam of electrons reflected from an object under observation, may benefit from various aspects of the embodiments of the invention discussed herein.

Although the present invention has been described with reference to specific embodiments and structural elements, those of ordinary skill in the art will understand that alternate embodiments may differ in certain respects without departing from the spirit or scope of the invention. For example, while detailed data structures employing fields of specific size and function have been disclosed, such data structures and associated definitions represent but one model of that which is possible in various embodiments of the invention. Also, the specific configuration of hardware and software components employed in the disclosed embodiments represent just one possible example of a system incorporating the principles of the invention. Accordingly, the proper scope of the invention is not limited to the disclosed embodiments, but is defined by the appended claims.

We claim:

1. A charged particle beam system for directing a charged particle beam onto a device under test (DUT), comprising:
a charged particle beam generation unit configured to emit a charged particle beam; and
a scan controller arrangement implementing a finite state machine configured to generate electronic scanning control signals to control application of the charged particle beam according to a plurality of scanning control parameters.

2. The charged particle beam system of claim 1, wherein the scanning control parameters describe a rectangular scan frame comprising a plurality of scan lines.

3. The charged particle beam system of claim 2, wherein the scanning control parameters comprise an initial x-position of the charged particle beam, an initial y-position of the charge particle beam, a scan width and a scan height.

4. The charged particle beam system of claim 3, wherein the scanning control parameters further comprise:
a horizontal step size defining a focused ion beam displacement along the scan width beginning with the initial x-position; and
a vertical step size defining a focused ion beam displacement between the plurality of scan lines along the scan height.

5. The charged particle beam system of claim 3, wherein the scanning control parameters further comprise:
a first charged particle beam blanking value defining a beginning portion of a scan line during which the charged particle beam is deactivated by the scan generation controller arrangement; and
a second charged particle beam blanking value defining an ending portion of a scan line during which the charged particle beam is deactivated by the scan controller arrangement.

6. The charged particle beam system of claim 1, wherein the scanning control parameters describe a bit-mapped arbitrarily-shaped scan region composed of individually-specified pixels over which the scan controller arrangement directs movement of the charged particle beam during application.

7. The charged particle beam system of claim 6, wherein the scanning control parameters comprise an x-position of the charged particle beam and a y-position of the charged particle beam for each pixel.

8. The charged particle beam system of claim 1, wherein the scanning control parameters describe a plurality of scan regions concurrently, the control parameters further comprising a next area value for each scan region indicating the order of application of the charged particle beam to the plurality of scan regions.

9. The charged particle beam system of claim 1, wherein the scanning control signals comprise an x-position for application of the charged particle beam and a y-position for application of the charged particle beam.

10. The charged particle beam system of claim 1, the scanning control signals further comprising a blanking signal configured to prevent application of the charged particle beam.

11. The charged particle beam system of claim 1, further comprising:
a charge control unit configured to inject electrons in the area of the DUT impacted by the charge particle beam to limit accumulation of positive charge on the surface of the DUT, the charge control unit being controlled by the finite state machine of the scan controller arrangement.

12. The charged particle beam system of claim 11, wherein the scan controller arrangement causes the charge control unit to emit electrons between scan lines of a rectangular scan frame.

13. The charged particle beam system of claim 11, wherein the scan controller arrangement causes the charge control unit to emit electrons between rectangular scan frames.

14. The charged particle beam system of claim 11, wherein the scan controller arrangement also controls a repel function of the charge control unit adapted to apply an electric field near an end of the charge particle beam generation unit nearest the DUT.

15. The charged particle beam system of claim 1, wherein the charged particle beam is an ion beam.

16. The charged particle beam system of claim 1, further comprising an ion column control unit configured to offset and magnify a scan region within a field of view of the DUT.

17. The charged particle beam system of claim 1, further comprising a gas injection unit configured to introduce a gas into the environment of the charged particle beam and the DUT to facilitate editing of the DUT.

18. The charged particle beam system of claim 17, wherein the editing of the DUT involves removing material from the DUT.

19. The charged particle beam system of claim 17, wherein the editing of the DUT involves depositing material onto the DUT.

* * * * *